(12) United States Patent
Lien et al.

(10) Patent No.: US 6,774,672 B1
(45) Date of Patent: Aug. 10, 2004

(54) FIELD-PROGRAMMABLE GATE ARRAY ARCHITECTURE

(75) Inventors: Jung-Cheun Lien, San Jose, CA (US); Sheng Feng, Cupertino, CA (US); Tong Liu, San Jose, CA (US)

(73) Assignee: Actel Corporation, Mountain View, CA (US)

( * ) Notice: Subject to any disclaimer, the term of this patent is extended or adjusted under 35 U.S.C. 154(b) by 19 days.

(21) Appl. No.: 10/334,339

(22) Filed: Dec. 30, 2002

(51) Int. Cl.[7] ............................................. H03K 19/173
(52) U.S. Cl. ............................. 326/47; 326/39; 326/41
(58) Field of Search ............................... 326/38–41, 47

(56) References Cited

U.S. PATENT DOCUMENTS

| | | | |
|---|---|---|---|
| 4,758,745 A | 7/1988 | Elgamal et al. ............. 307/465 |
| 5,451,887 A | 9/1995 | El-Avat et al. ............... 326/39 |
| 5,477,165 A | 12/1995 | ElAyat et al. ................. 326/38 |
| 5,570,041 A | 10/1996 | El-Avat et al. ............... 326/41 |
| 5,606,267 A | 2/1997 | El Ayat et al. ................ 326/41 |
| 5,625,301 A | 4/1997 | Plants et al. .................. 326/41 |
| 5,698,992 A | 12/1997 | El Ayat et al. ................ 326/41 |
| 5,870,410 A | * 2/1999 | Norman et al. ............. 714/725 |
| 6,211,697 B1 | 4/2001 | Lien et al. ..................... 326/41 |
| 6,252,273 B1 | 6/2001 | Salter, III et al. ........... 257/316 |
| 6,255,848 B1 | * 7/2001 | Schultz et al. ................ 326/41 |
| 6,285,212 B1 | 9/2001 | Kaptanoglu et al. .......... 326/41 |
| 6,476,636 B1 | 11/2002 | Lien et al. ..................... 326/41 |
| 6,504,398 B1 | 1/2003 | Lien et al. ..................... 326/41 |

* cited by examiner

*Primary Examiner*—Anh Q. Tran
(74) *Attorney, Agent, or Firm*—Sierra Patent Group, Ltd.

(57) ABSTRACT

A field-programmable gate array (FPGA) is disclosed. A two-by-two array of FPGA tiles is surrounded by a JTAG interface, a Configuration interface and a BIST interface. Each interface is located adjacent to an outer edge of the two-by-two array of FPGA tiles. A plurality of boundary scan register chains are located adjacent to an outer perimeter of the two-by-two array of FPGA tiles and the JTAG, Configuration and BIST interfaces. A plurality of RAM blocks are located adjacent to an outer perimeter of the plurality of boundary register scan chains. A plurality of input/output pad rings is located adjacent to an outer perimeter of the plurality of ram blocks.

41 Claims, 23 Drawing Sheets

FIG. 2

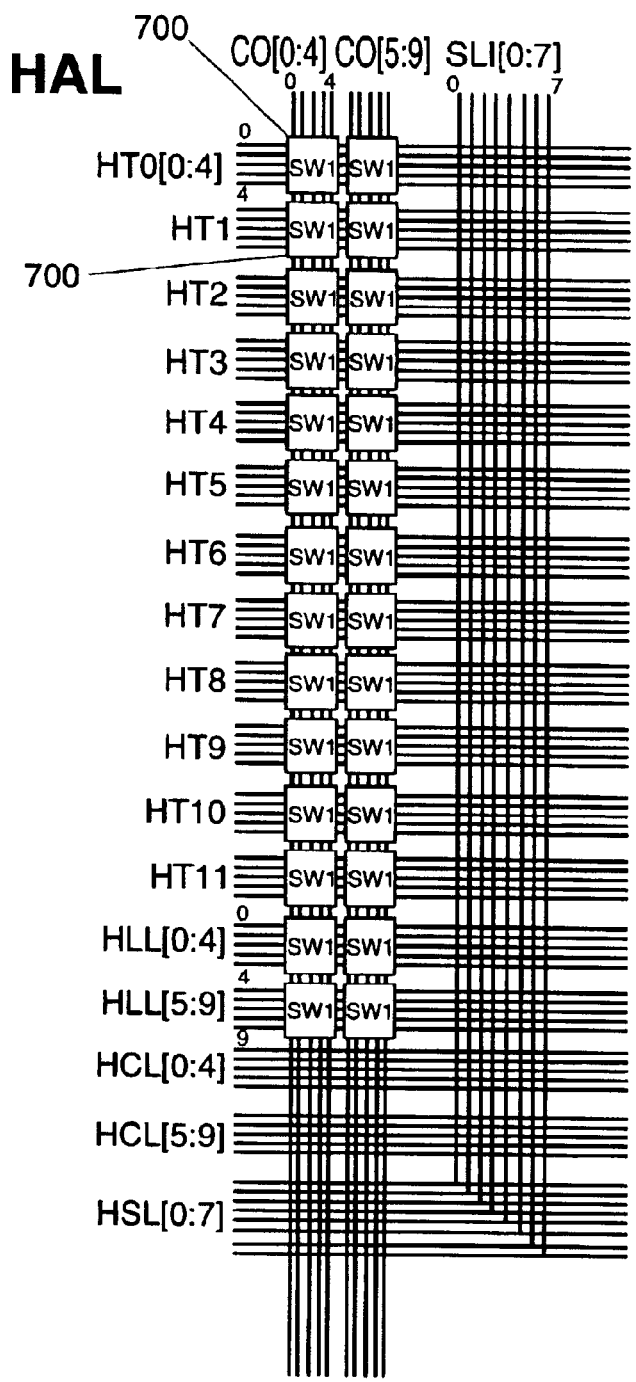
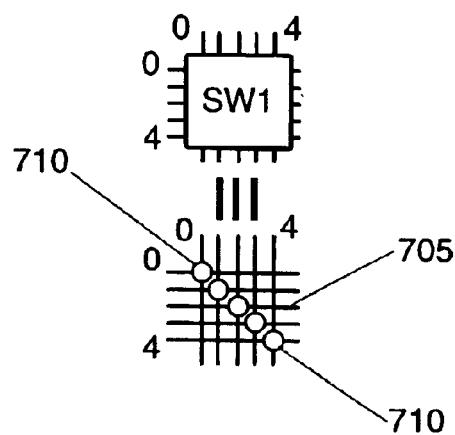
FIG. 14B
FIG. 14A

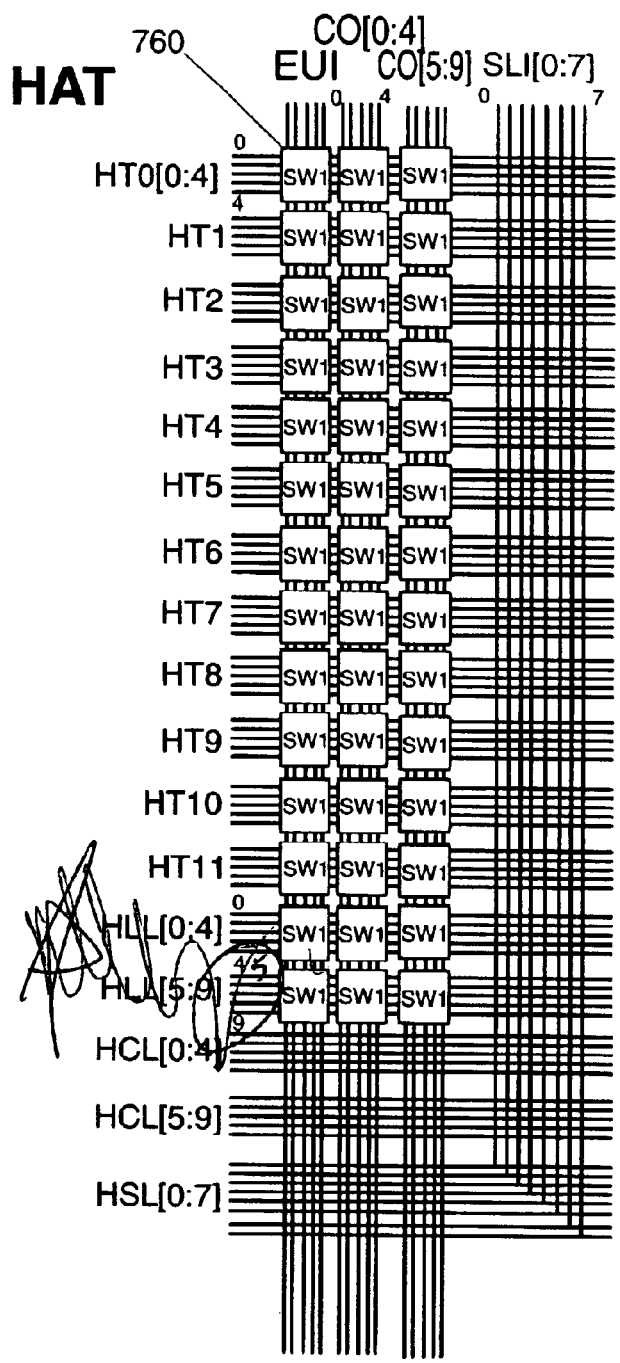
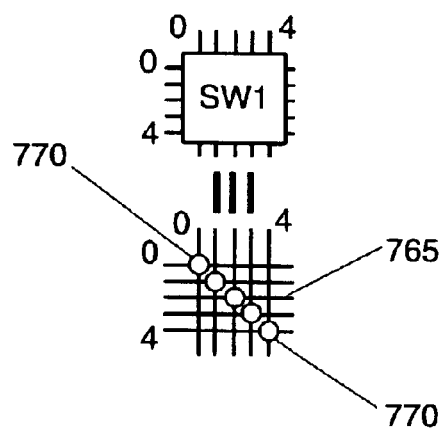
FIG. 17B
FIG. 17A

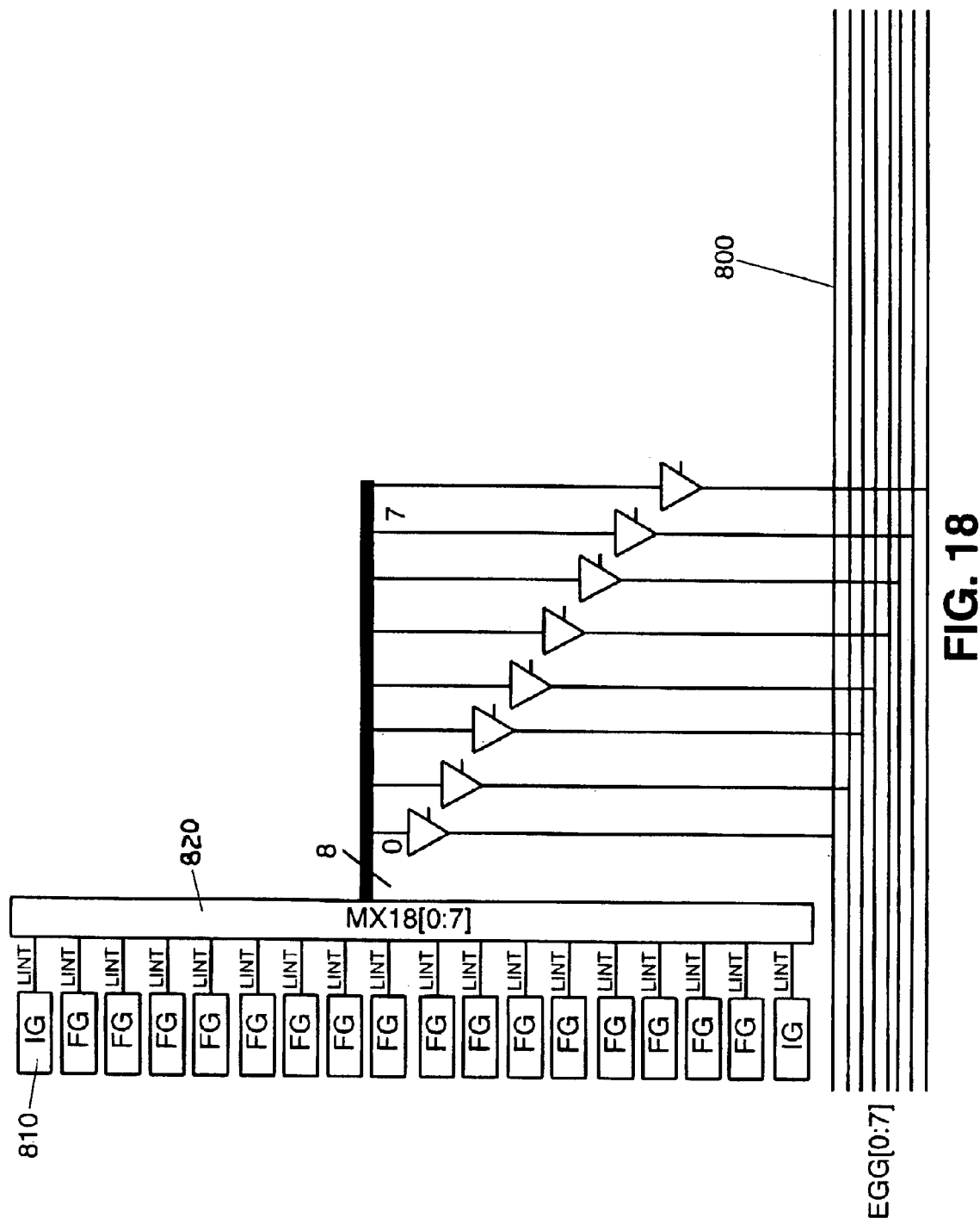

US 6,774,672 B1

FIELD-PROGRAMMABLE GATE ARRAY ARCHITECTURE

BACKGROUND OF THE INVENTION

1. Field of the Invention

The invention relates to field-programmable gate arrays, and more particularly, to an architecture for field-programmable gate arrays.

2. Description of the Related Art

A field-programmable gale array (FPGA) is an integrated circuit (IC) that includes a two-dimensional array of general-purpose logic circuits, called cells or logic blocks, whose functions are programmable. The cells are linked to one another by programmable buses. The cell types may be small multifunction circuits (or configurable functional blocks or groups) capable of realizing Boolean functions of a few variables. The cell types are not restricted to gates. For example, configurable functional groups ("FGs") typically include memory cells and connection transistors that may be used to configure logic functions such as addition, subtraction, etc., inside of the FPGA. A cell may also contain at least one flip-flop. Some types of logic cells found in FPGAs are those based on multiplexers and those based on programmable read only memory (PROM) table-lookup memories. Erasable FPGAs can be reprogrammed repeatedly. This technology is convenient when developing and debugging a prototype design for a new product and for small-scale manufacture.

FPGAs typically include a physical template that includes an array of circuits, sets of uncommitted routing interconnects, and sets of user programmable switches associated with both the circuits and the routing interconnects. When these switches are properly programmed (set to on or off states), the template or the underlying circuit and interconnect of the FPGA is customized or configured to perform specific customized functions. By reprogramming the on-off states of these switches, an FPGA can perform many different functions. Once a specific configuration of an FPGA has been decided upon, it can be configured to perform that one specific function.

The user programmable switches in an FPGA can be implemented in various technologies, such as ONO antifuse, M-M antifuse, SRAM memory cell, Flash EPROM memory cell, and EEPROM memory cell. FPGAs that employ fuses or antifuses as switches can be programmed only once. A memory cell controlled switch implementation of an FPGA can be reprogrammed repeatedly. In this scenario, an NMOS transistor is typically used as the switch to either connect or disconnect two selected points (A, B) in the circuit. The NMOS' source and drain nodes are connected to points A, B respectively, and its gate node is directly or indirectly connected to the memory cell. By setting the state of the memory cell to either logical "1" or "0", the switch can be turned on or off and thus point A and B are either connected or disconnected. Thus, the ability to program these switches provides for a very flexible device.

FPGAs can store the program that determines the circuit to be implemented in a RAM or PROM on the FPGA chip. The pattern of the data in this configuration memory ("CM") determines the cells' functions and their interconnection wiring. Each bit of CM controls a transistor switch in the target circuit that can select some cell function or make (or break) some connection. By replacing the contents of CM, designers can make design changes or correct design errors. The CM can be downloaded from an external source or stored on-chip. This type of FPGA can be reprogrammed repeatedly, which significantly reduces development and manufacturing costs.

In general, an FPGA is one type of programmable logic device (PLD), i.e., a device that contains many gates or other general-purpose cells whose interconnections can be configured or "programmed" to implement any desired combinational or sequential function. As its name implies, an FPGA is "field-programmable", meaning that the device is generally programmed by designers or end users "in the field" via small, low-cost programming units. This is in contrast to mask programmable devices which require special steps in the IC chip-manufacturing process.

A field-programming unit typically uses design software to program the FPGA. The design software compiles a specific user design, i.e., a specific configuration of the programmable switches desired by the end-user, into FPGA configuration data. The design software assembles the configuration data into a bit stream, i.e., a stream of ones and zeros, that is fed into the FPGA and used to program the configuration memories for the programmable switches or program the shift registers for anti-fuse type switches. The bit stream creates the pattern of the data in the configuration memory CM that determines whether each memory cell stores a "1" or a "0". The stored bit in each CM controls whether its associated transistor switch is turned on or off. End users typically use design software to test different designs and run simulations for FPGAs.

When an FPGA that has been programmed to perform one specific function is compared to an application specific integrated circuit (ASIC) that has been designed and manufactured to perform that same specific function, the FPGA will necessarily be a larger device than the ASIC. This is because FPGAs are flexible devices that are capable of implementing many different functions, and as such, they include excess circuitry that is either not used or could be replaced with hard-wired connections when performing one specific function. Such excess circuitry generally includes the numerous programmable transistor switches and corresponding memory cells that are not used in implementing the one specific function, the memory cells inside of functional groups, and the FPGA programming circuitry. This excess circuitry is typically eliminated in the design of an ASIC which makes the ASIC a smaller device. An ASIC, on the other hand, is not a flexible device. In other words, once an ASIC has been manufactured it cannot be reconfigured to perform a different function, which is possible with an FPGA.

Designers of FPGAs (as well as other PLDs) often provide their circuit designs to IC manufacturers who typically manufacture the FPGAs in two different ways. First, an FPGA design may be manufactured as its own chip with no other devices being included in the IC package. Second, an FPGA design may be embedded into a larger IC. An example of such a larger IC is a system on a chip (SOC) that includes the embedded FPGA as well as several other components. The several other components may include, for example, a microprocessor, memory, arithmetic logic unit (ALU), state machine, etc. In this scenario the embedded FPGA may be only a small part of the whole SOC.

BRIEF SUMMARY OF THE INVENTION

A field-programmable gate array (FPGA) is disclosed. A two-by-two array of FPGA tiles is surrounded by a JTAG interface, a Configuration interface and a BIST interface. Each interface is located adjacent to an outer edge of the two-by-two array of FPGA tiles. A plurality of boundary scan register chains are located adjacent to an outer perimeter of the two-by-two array of FPGA tiles and the JTAG, Configuration and BIST interfaces. A plurality of RAM blocks are located adjacent to an outer perimeter of the plurality of boundary register scan chains. A plurality of input/output pad rings is located adjacent to an outer perimeter of the plurality of ram blocks.

A better understanding of the features and advantages of the invention will be obtained by reference to the following detailed description of the disclosed system and accompanying drawings which set forth an illustrative embodiment in which the principles of the disclosed system are utilized.

BRIEF DESCRIPTION OF THE DRAWINGS

FIG. 2 is a schematic illustrating a more detailed view of the schematic in FIG. 1.

FIG. 8b is a schematic illustrating a programmable interconnect pattern for FIG. 8a.

FIG. 8c is a schematic illustrating a programmable interconnect pattern for FIG. 8a.

FIG. 9b is a schematic illustrating a programmable interconnect pattern for FIG. 9a.

FIG. 10b is a schematic illustrating a programmable interconnect pattern for FIG. 10a.

FIG. 10c is a schematic illustrating a programmable interconnect pattern for FIG. 10a.

FIG. 10d is a schematic illustrating a programmable interconnect pattern for FIG. 10a.

FIG. 11a is a schematic illustrating a programmable interconnect pattern for FIG. 10a.

FIG. 12b is a schematic illustrating a programmable interconnect pattern for FIG. 12a.

FIG. 12c is a schematic illustrating a programmable interconnect pattern for FIG. 12a.

FIG. 14a is a schematic illustrating a more detailed view of a bus featured in FIG. 6.

FIG. 14b is a schematic illustrating a programmable interconnect pattern for FIG. 14a.

FIG. 15b is a schematic illustrating a programmable interconnect pattern for FIG. 15a.

FIG. 15c is a schematic illustrating a programmable interconnect pattern for FIG. 15a.

FIG. 17a is a schematic illustrating a more detailed view of a bus featured in FIG. 7.

FIG. 17b is a schematic illustrating a programmable interconnect pattern for FIG. 17a.

FIG. 18 is a schematic illustrating one embodiment of a secondary intra-tile global routing resource.

DETAILED DESCRIPTION OF THE INVENTION

Figure 1:
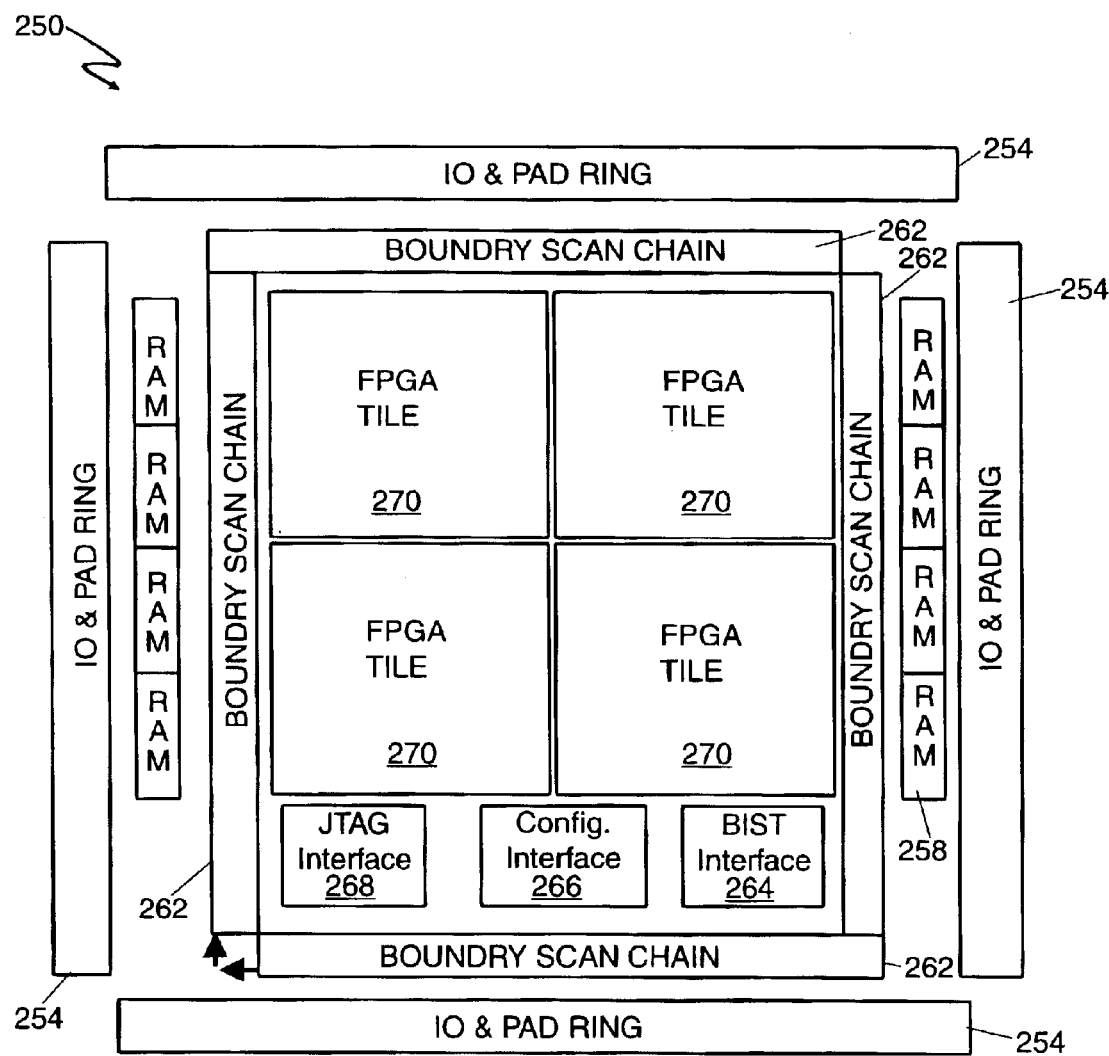
FIG. 1 is a schematic illustrating an overall view of one embodiment of the invention.

In FIG. 1, an overall view of one embodiment of the disclosed system is shown. Field-programmable gate array (FPGA) 250 has IO & PAD ring 254 on the outer perimeter. RAM blocks 258 are between IO & PAD ring 254 and boundary scan chains 262. Circuitry within and including boundary scan chains 262 forms a core to which RAM may be added. This core is also easily adapted to other configurations.

In this embodiment four FPGA tiles 270 are shown arranged in a 2 by 2 matrix. Built in self-test interface module ("BIST") 264 is adjacent to FPGA tiles 270. BIST 264 can generate test patterns, apply test patterns to a circuit being tested by executing predefined test procedures, and collect/analyze test results. Configuration interface 266 is a configuration control module that receives the bitstream program into its configuration RAM. Configuration interface 266 receives the CM and configures the functionality of the FPGA. Joint test action group ("JTAG") interface 268 is a module that is an access point that allows for high-level test control. Alternative name for JTAG interface 268 is IEEE Std. 1149.1 Boundary Scan Architecture Standard. This standard defines a common method to control or access test structures available on chips in a system.

Figure 2:
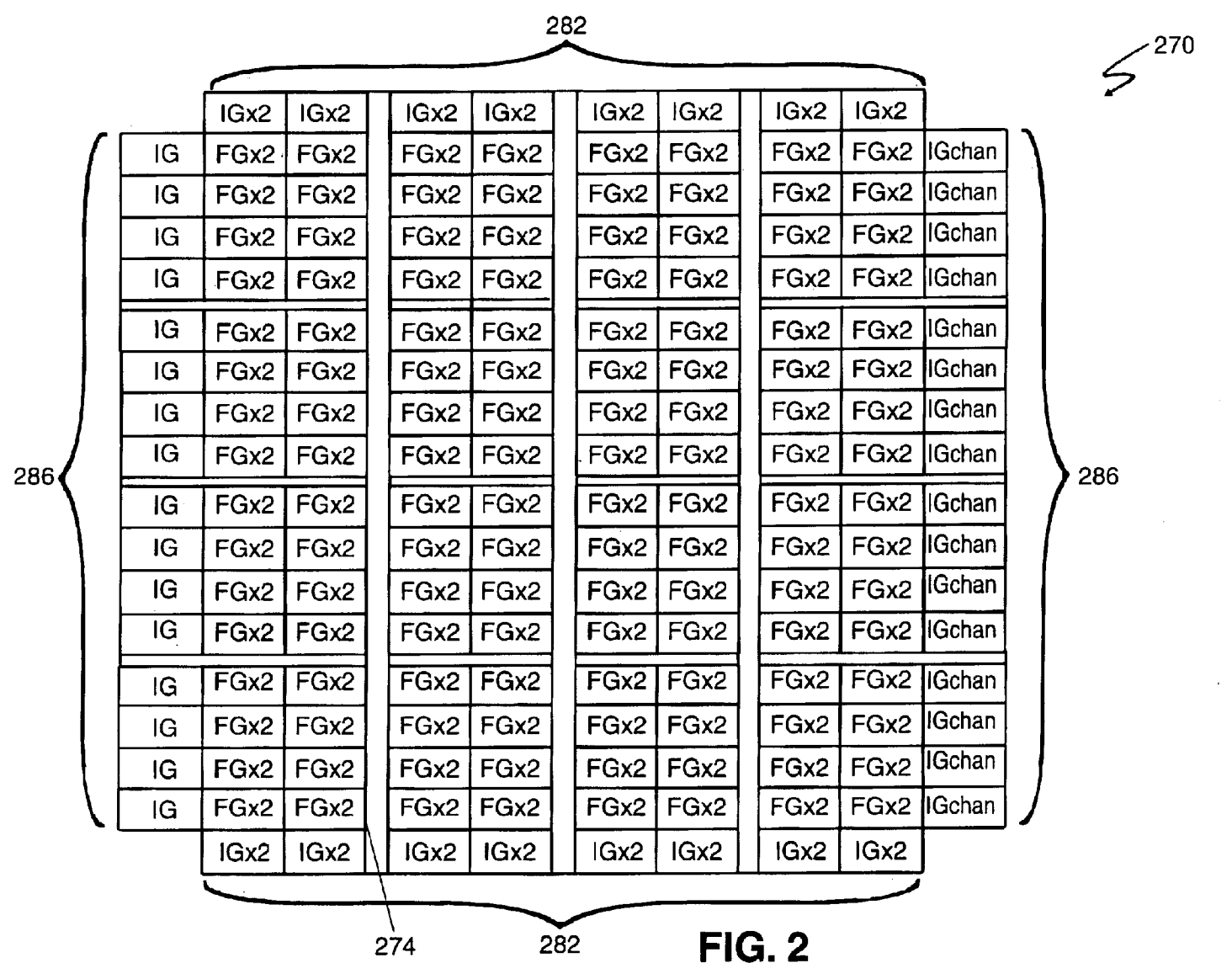

FIG. 2 is a schematic illustrating a more detailed view of FPGA tile 270 from FIG. 1. In one embodiment, each FPGA tile is made up of a plurality of pairs of functional groups (FGs—each pair referred to as a "FGx2") 274 arranged in a side-by-side manner. FGs are small multifunction circuits that are capable of realizing many Boolean functions. The FGs include look-up tables (LUTs) and other circuits capable of realizing Boolean functions, as well as memory cells that are used to configure logic functions such as addition, subtraction, etc.

Still referring to FIG. 2, in one embodiment FGx2s 274 are arranged in a 16 by 8 array of FGx2s. Since an FGx2 is a pair of side by side FGs, then this array is equivalent to a 16 by 16 array of FGs. Each row containing 8 FGx2s comprise 16 FGs because there are 2 side by side FGs in each FGx2. Please refer to FIG. 3 for a more detailed view of FGx2 274.

Around the outer perimeter of the 16x8 FGx2 array are interface groups ("IGs") 286. IGs 286 provide an interface for FPGA tiles 270 to other FPGA tiles or devices, or to pad rings for connecting the FPGA tiles to IC package pins. In general, the logic structure of the FPGA tile is provided by the FGs and the IGs. The IGs are arranged around the FG×2 array as follows: There are two columns of IGs 286, one on the left side and one on the right side of the FG×2 array. There are two rows 282 of pairs of IGs referred to as IG×2 located on the top side and bottom side of the FG×2 array.

Also included in the FPGA tiles, but not shown in FIG. 2, are several horizontal and vertical regular routing buses, routing interconnect areas, switching transistors, and global signal distribution routing structure, all of which will he discussed below.

Figure 3:
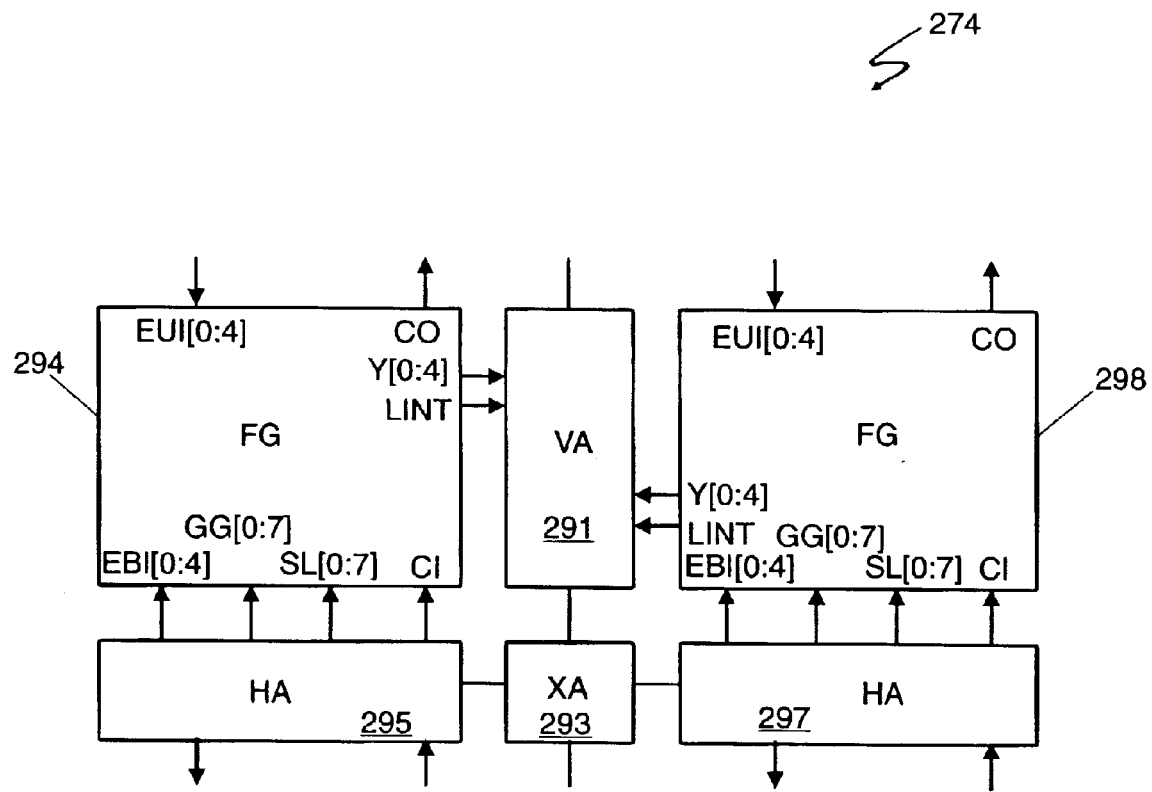
FIG. 3 is a schematic illustrating one embodiment of a functional group.

FIG. 3 illustrates a more detailed view of FG×2 274. Two FGs 294 and 298 comprise FG×2 274. Each of FGs 294 and 298 are configured to receive inputs from the following routing resources: EUI[0:4], EBI[0:4], GG[0:7], SL[0:7] and CI. Both of FGs 294 and 298 are also configured to send outputs through the following resources: CO, Y[0:41], and LINT ports. The LINT ports carry a secondary routing signal. Between FGs 294 and 298 is a vertical channel containing vertical bus VA 291 which carries the following routing resources: VT[0:11][0:4], VSL[0:71], VLL[0:9], and VCL[0:9]. The convention of [0:11][0:4] means that there are 12 (0 through 11) sets of 5 (0 through 4) routing resources. Adjacent to VA bus 291 is cross bus XA 293. The routing within XA 293 is described in detail in FIG. 10. Horizontal busses HA 295 and 297 carry the following routing resources: HT[0:11][0:4], HSL[0:7], HLL[0:9], HCL[0:9], and HFT[0:4].

Figure 4:
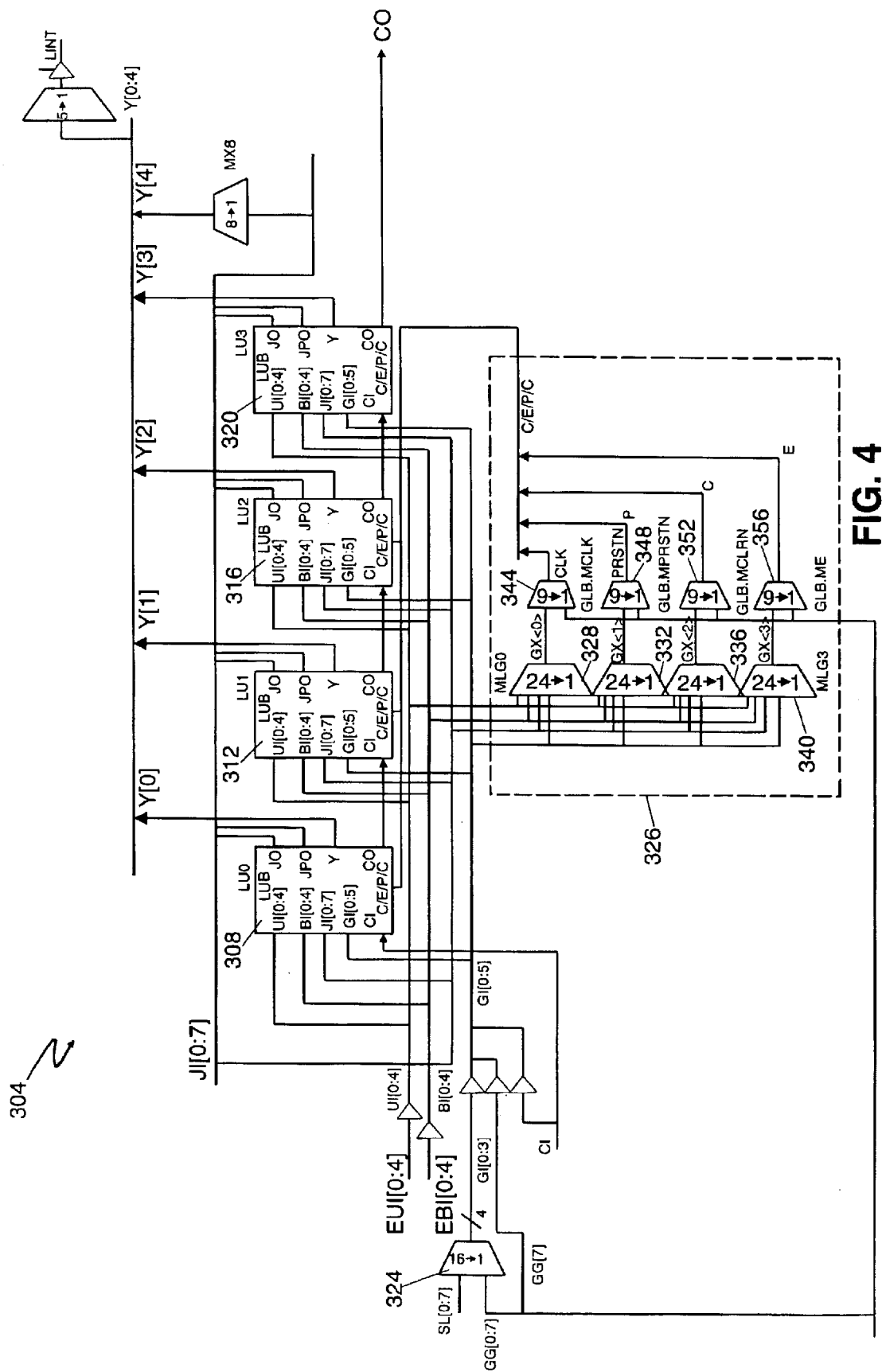
FIG. 4 is a schematic illustrating a more detailed view of a functional group, featuring logic units and associated circuitry.

FIG. 4 illustrates a schematic providing a more detailed view of FGs from FIG. 3. Each FG 304 may include four logic units ("LUBs") 308, 312, 316, 320. Each LUB is coupled to routing resource Y[0] through Y[3] respectively. LUBs 308, 312, 316 and 320 provide Boolean functions and logic operations of FG 304. Each of the LUBs 308, 312, 316 and 320 includes several inputs on which Boolean functions and logic operations are performed. As shown, each of LUBs 308, 312, 316 and 320 includes twenty-four such inputs (not including the CI routing resource), but it should be understood that the number of inputs may vary in accordance with the invention. Specifically, each of LUBs 308, 312, 316 and 320 receives signals through input ports UI[0:4] and BI[0:4] which correspond to signals received through regular input ports EUI[0:4] and EBI[0:4]. Also, each of LUBs 308, 312, 316 and 320 receives signals through input ports GI[0:5] and JI[0:7]. The input signals via input port JI[0:7] include two output signals JO and JPO from each of LUBs 308, 312, 316 and 320. Thus, two output signals JO and JBO of each of LUBs 308, 312, 316 and 320 are fed back to the inputs by way of JI[0:7].

Input signals GI[0:5] are selected from the SL[0:7] and GG[0:7] routing resources. Sixteen-to-one multiplexer 324 selects one of the inputs from routing resources SL[0:7] and GG[0:7] and makes four copies of the selected input, as indicated by the slash "/" and associated number "4". Thus the routing resource GI[0:3] is shown exiting multiplexer 324. Routing resource GG[7] and CI are added to the GI[0:31] bus, thereby forming a GI[0:5] bus.

Each of LUBs 308, 312, 316 and 320 also includes a clock/enable/preset/clear ("C/E/P/C") input. The C/E/P/C input is used to control a flip-flop included inside each of LUBs 308, 312, 316 and 320. The C/E/P/C input signal is generated by selection circuitry, shown in the dashed lines of box 326. The C/E/P/C selection circuitry receives inputs UI[0:4], BI[0:4], JI[0:7], and GI[0:5] at each of twenty-four-to-one multiplexers 328, 332, 336 and 340. Each multiplexer 328, 332, 336 and 340 selects one signal from buses UI[0:4], BI[0:4], JI[0:7], and GI[0:5]. Each signal selected by each multiplexer 328, 332, 336 and 340 is sent to nine-to-one multiplexers 344, 348, 352, and 356 via routing resources GX[0], GX[1], GX[2], and GX[3] respectively. Each of nine-to-one multiplexers 344, 348, 352, and 356 also receives an input from the GG[0:7] routing resource. The signal selected by multiplexer 344 becomes clock signal CLK, the signal selected by multiplexer 348 becomes preset signal PRSTN ("P"), the signal selected by multiplexer 352 becomes clear signal CLRN("C"), and the signal selected by multiplexer 356 becomes enable signal E. The use of multiplexers 344, 348, 352 and 356 allows any of the signals GX[0:3], GG[0:7], and ground to be selected as one of the C/E/P/C signals.

The GG[0:7] bus is an inter-tile global bus that is coupled to every FG in all FPGA tiles. The signals in the GG[0:7] bus are often selected as the C/E/P/C signals. It should be well understood, however, that the illustrated C/E/P/C selection circuitry from FIG. 4 is just one embodiment of such a selection circuit and that various different designs of C/E/P/C selection circuit in box 326 may be used to select various different signals in accordance with the invention.

It should be understood, however, that various different designs of the circuitry discussed above may be used to select various different numbers of signals for LUBs 308, 312, 316 and 320 in accordance with the invention. In one embodiment, LUBs 308, 312, 316 and 320 are all of the same design, but in another embodiment they are not of the same design.

Figure 5:
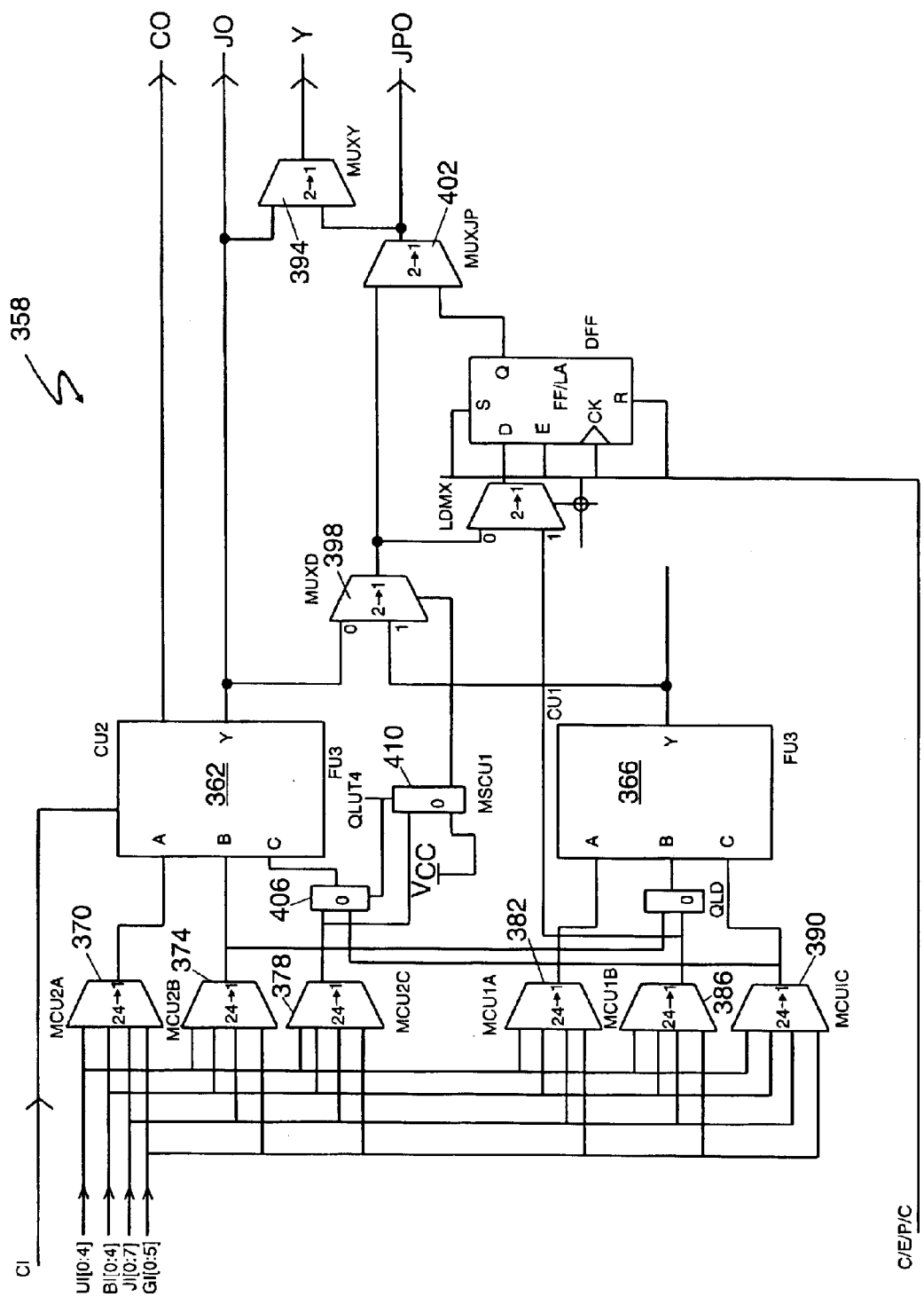
FIG. 5 is a schematic illustrating a more detailed view of a logic unit, featuring look-up tables and associated circuitry.

FIG. 5 illustrates a more detailed view of one of LUBs 308, 312, 316, and 320 from FIG. 4. LUB 358 includes two look-up tables ("LUTs") 362 and 366. Each LUT 362 and 366 comprises three inputs A, B, C, one output Y, and several internal memory cells (not shown). LUT 362 also comprises output CO. LUTs 362 and 366 are configured by programming internal memory cells (not shown), and the setting of the internal memory cells taken together provides a specific configuration for each of LUTs 362 and 366. Configuration data used to program the internal memory cells is generated by design software. Once a specific configuration of the internal memory cells is decided upon, inputs A, B, C may be used to generate output Y in accordance with the desired logic function.

Inputs A, B, C of the LUT 362 are provided by twenty-four-to-one multiplexers 370, 374 and 378, respectively, and inputs A, B, C of LUT 366 are provided by twenty-four-to-one multiplexers 382, 386 and 390, respectively. Each of multiplexers 370, 374, 378, 382, 386, 390 receives as inputs buses EUI[0:4], EBI[0:4], JI[0:71], and GI[0:5], comprising twenty four inputs in total. Three signals are selected from these twenty-four signals as inputs A, B, C for each of LUTs 362 and 366.

When only a three input LUT is needed, one of LUTs 362 and 364 is used. In one embodiment, LUT 362 is used while LUT 364 is not used. The Y output of LUT 362 can be sent directly to the JO output of LUB 358, or the Y output of LUT 362 can be sent to the Y output of LUB 358 by using two-to-one multiplexer 394 to select the Y output of LUT 362. Additionally, the Y output of LUT 362 can be sent to the JPO output of the LUB 358 by using two-to-one multiplexer 398 to select the Y output of the LUT 362 and two-to-one multiplexer 402 to select the output of multiplexer 398. Thus, multiplexers 394, 398 and 402 can be used to send the Y output of LUT 362 to any of the outputs Y, JO, JPO of the LUB 358.

Additionally, when two, three input LUTs are needed, LUT 362 and 366 can be used independently as three input LUTs. The Y output of LUT 362 can be sent directly to the JO output of LUB 358, or the Y output of the LUT 362 can be sent to the Y output of the LUB 358 by using two-to-one multiplexer 394 to select the Y output of LUT 362. The Y output of LUT 366 can be sent directly to the JPO output of LUB 358, or the Y output of the LUT 366 can be sent to the Y output of the LUB 358 by using two-to-one multiplexer 394 to select the output of two-to-one multiplexer 402, which can select the output of two-to-one multiplexer 398, which can select the Y output of the LUT 366.

As stated previously, one purpose of including two LUTs in the LUB is so that they can be used together to provide a four-input LUT. Specifically, the Y output of LUT 362 and the Y output of LUT 366 are connected to the inputs of two-to-one multiplexer 398. In order to simulate a single, four-input LUT, two-to-one multiplexer 406 selects the signal from twenty-four-to-one multiplexer 390 as input C to LUT 362. Two-to-one multiplexer 410 selects the signal from twenty-four-to-one multiplexer 378 as the fourth input to LUT 362. Thus, both LUTs 362 and 366 receive the first, second and third inputs at their A, B, and C inputs and multiplexer 410 is programmed to select the fourth input and provide it to the control input of multiplexer 398.

According to well-known Boolean logic techniques and the Shannon Expansion, connecting three-input LUTs 362 and 366 in this manner will simulate a single four-input LUT with the result being generated at the output of multiplexer 398. The output of multiplexer 398 can be provided to the JPO output is of LUB 358 by way of multiplexer 402 or to the Y output of LUB 358 by way of the multiplexers 394 and 402.

Figure 6:
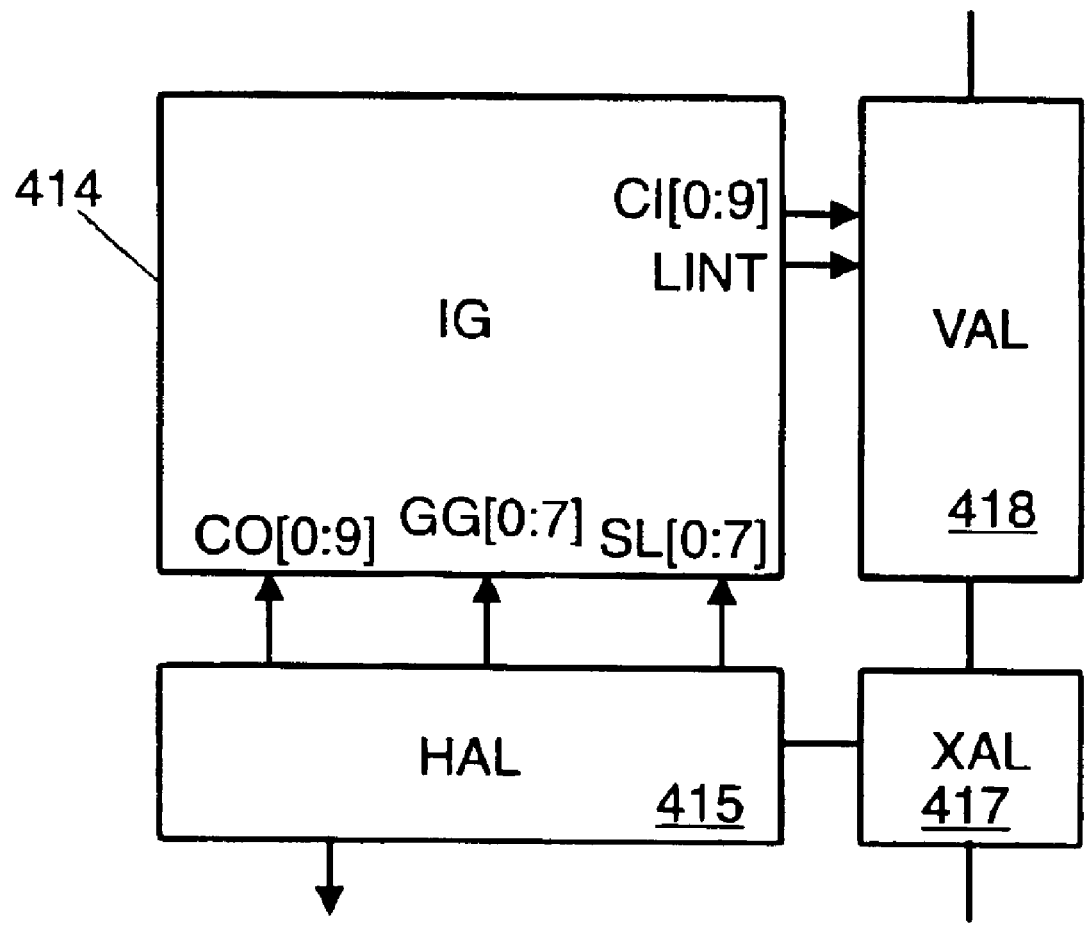
FIG. 6 is schematic illustrating a more detailed view of an interconnect featured in FIG. 2.

FIG. 6 illustrates a more detailed view of the routing resources adjacent to IGchan 286 of FIG. 2. Vertical bus (VAL) 418 and horizontal bus (HAL) 415 are shown adjacent to the IGchan 414. Positioned diagonal to Igchan 414 is cross-bus (XAL) 417. IGchan 414 has the following inputs: PI[0:13], CO[0:9], GG[0:7], SL[0:7] and the following outputs: PO[0:13], LINT, and CI[0:9]. The CO[0:9], GG[0:7], and SL[0:7] inputs are coupled to HAL bus 415. The CI[0:9] and LINT outputs are coupled to the VAL bus 418.

Figure 7:
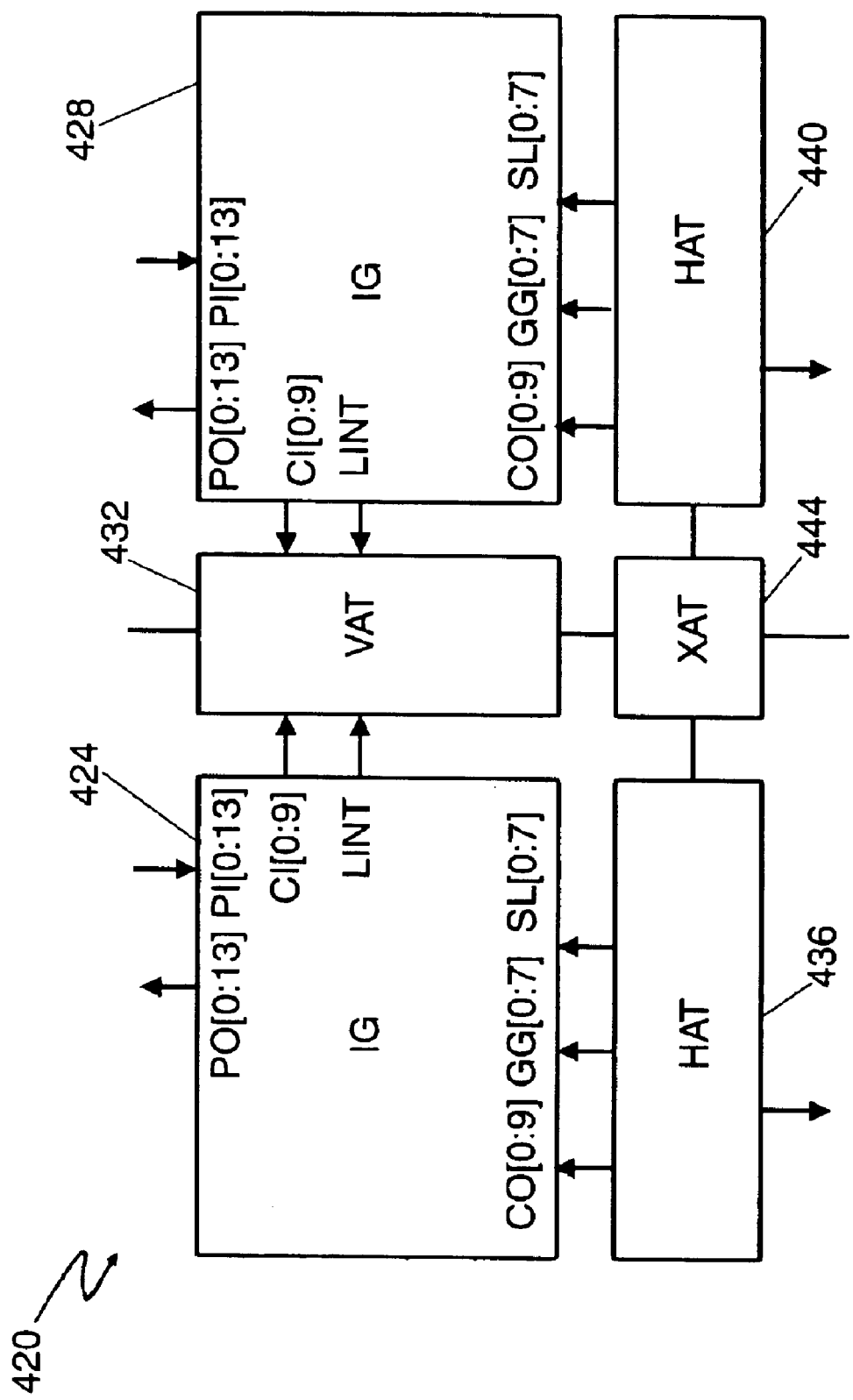
FIG. 7 is a schematic illustrating a more detailed view of the interconnect featured in FIG. 6.

FIG. 7 illustrates a more detailed view of a typical IG×2 as first shown in FIG. 2. The IGx2 420 has two IGs 424 and 428. Between IGs 424 and 428 is vertical bus VAT 432. Below and adjacent to each of IGs 424 and 428 are horizontal busses HAT 436 and 440. Adjacent to VAT 432 and HAT busses 436 and 440 is cross bus XAT 444. Each of IGs 424 and 428 has outputs PO[0:13], CI[0:9], and LINT. Each of IGs 424 and 428 has inputs PI[0:13], CO[0:9], GG[0:7], and SL[0:7].

Routing resources, or conductors, and interconnect configurations for the disclosed buses are now described.

Figure 8A:
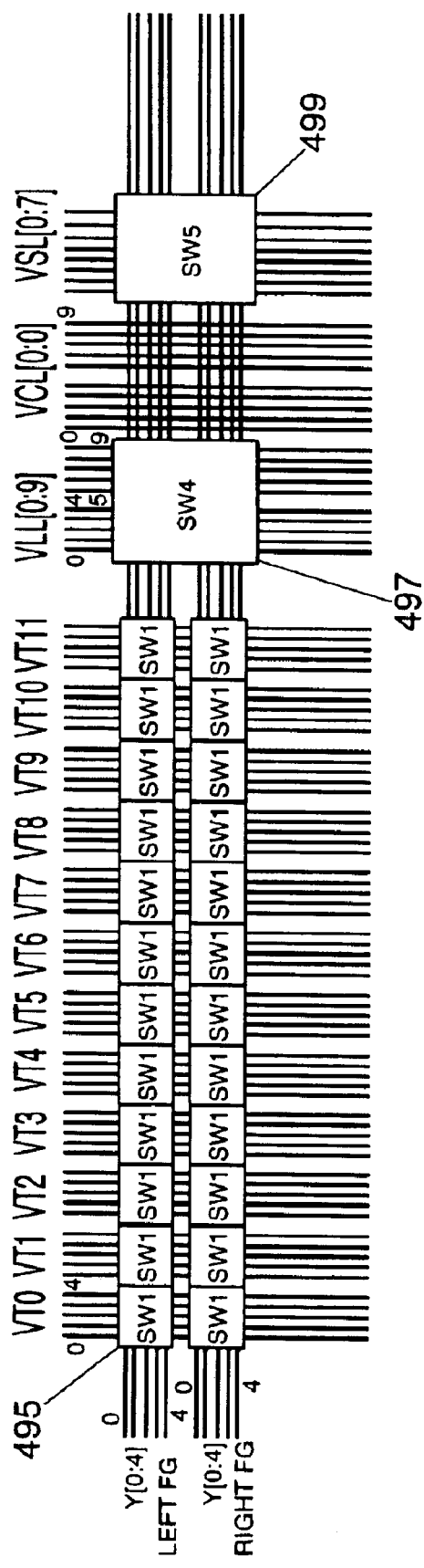
FIG. 8a is a schematic illustrating a more detailed view of a bus featured in FIG. 3.

FIG. 8a illustrates routing resources for VA bus 291, shown in FIG. 3. Routing resource VT[0:11][0:4] is shown as 12 (0 through 11) sets of 5 (0 through 4) routing resources. VT[0:11][0:4] intersect routing resource Y[0:4] for a left FG (that is the FG on the left side of the VA, for example FG 294 of FIG. 3) and another Y[0:4] for a right FG (that is the FG on the right side of the VA, for example FG 298 of FIG. 3) at SW1. Routing resources VLL[0:9], VCL[0:9] and VSL[0:7] are also shown. VLL[0:9] and VSL[0:7] intersect both of the Y[0:4] routing resources at areas SW4 and SW5.

Figure 8B:
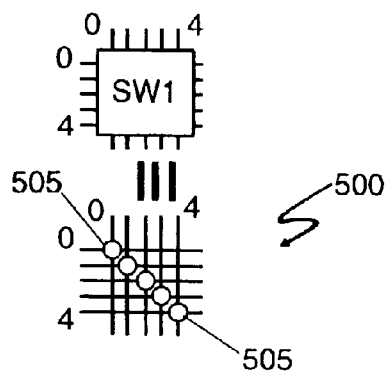
Figure 8C:
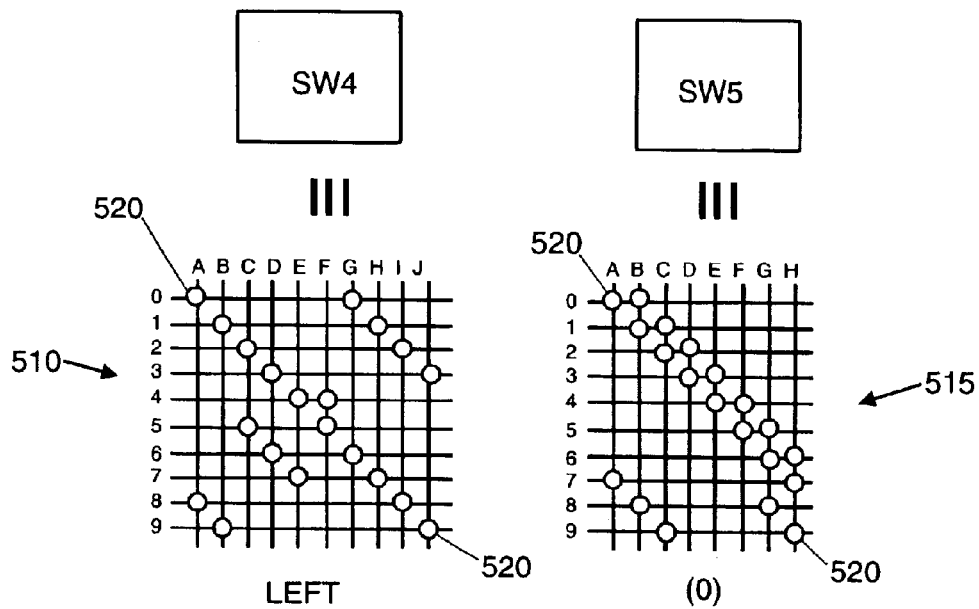
Figure 8D:
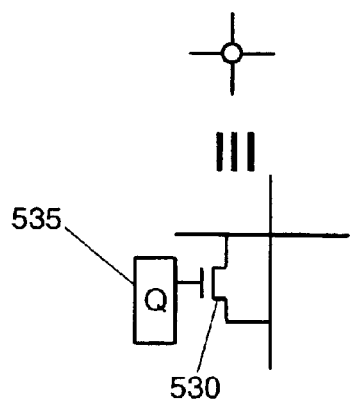
FIG. 8d is a schematic illustrating one embodiment of a more detailed programmable interconnect.

FIGS. 8b, 8c, and 8d illustrate SW1, SW4 and SW5 in greater detail. In FIG. 8b, SW1 represents programmable interconnects distributed in pattern 500. Circle, or bubble, 505 represents a transistor switch and memory cell coupling together the lines that intersect at circle 505. For example, referring to FIGS. 8a and 8b, and SW1 495, circle 505 is at the intersect of lines Y[0] with VT0[0] and VT1[0] and VT2[0] and VT3[0] and VT4[0] and VT5[0] and VT6[0] and VT7[0] and VT8[0] and VT9[0] and VT10[0] and VT 11[0], Y[1] with VT0[1] and VT1[1] and VT2[1] and VT3[1] and VT4[1] and VT5[1] and VT6[1] and VT7[1] and VT8[1] and VT9[1] and VT10[1] and VT11[1].

FIG. 8c illustrates the programmable interconnect patterns for areas SW4 and SW5 from FIG. 8a. In patterns 510 and 515, circle 520 represents a transistor switch and memory cell coupling together the lines that intersect at circle 520. For example, referring to FIG. 8a and 8c , SW4 497, or pattern 510, represents the interconnects for left FG Y[0:4] and right FG Y[0:4] and VLL[0:9]. Therefore, circle 520 is at the intersect of lines, for the left FG, Y[0] with VLL[0] and VLL[6], Y[1] with VLL[] and VLL[7], Y[2] with VLL[2] and VLL[8], Y[3] with VLL[3] and VLL[9], Y[4] with VLL[4] and VLL[5], and so on, through, for the right FG, Y[4] with VLL[1] and VLL[9].

Another method of identifying pattern 510 is to label the vertical set of conductors with a letter, left to right, from letter 'A' to letter 'J,' and the horizontal set of conductors with a number, top to bottom, from number '0' to number '9.' The conductors are therefore coupled together at the intersection of A0, G0, B1, H1, C2, I2, D3, J3, E4, F4, C5, F5, D6, G6, E7, H7, A8, I8, B9, and J9.

SW5 499, or pattern 515, represents the interconnects for left FG Y[0:4] and right FG Y[0:4] and VSL[0:7]. Therefore, circle 520 is at the intersect of lines, for the left FG, Y[0] with VSL[0] and VSL[1], Y[1] with VSL[1] and VSL[2], Y[2] with VSL[2] and VSL[3], Y[3] with VSL[3] and VSL[4], Y[4] with VSL[4] and VSL[5], and so on, through, for the right FG, Y[4] with VSL[2] and VSL[7].

Another method of identifying pattern 515 is to label the vertical set of conductors with a letter, left to right, from letter 'A' to letter 'H,' and the horizontal set of conductors with a number, top to bottom, from number '0' to number '9.' The conductors are therefore coupled together at the intersection of A0, B0, B1, C1, C2, D2, D3, E3, E4, F4, F5, G5, G6, H6, A7, H7, B8, G8, C9, and H9.

FIG. 8d is a schematic illustrating one embodiment of the circles in FIGS. 8b and 8c. Transistor switch 530 has its source and drain coupled to intersecting signal lines and its gate coupled to memory cell 535. Each memory cell stores one bit of configuration data to control whether or not its corresponding transistor switch is turned on or off. When a transistor switch is turned on, the lines to which it is connected are coupled together.

Figure 9A:
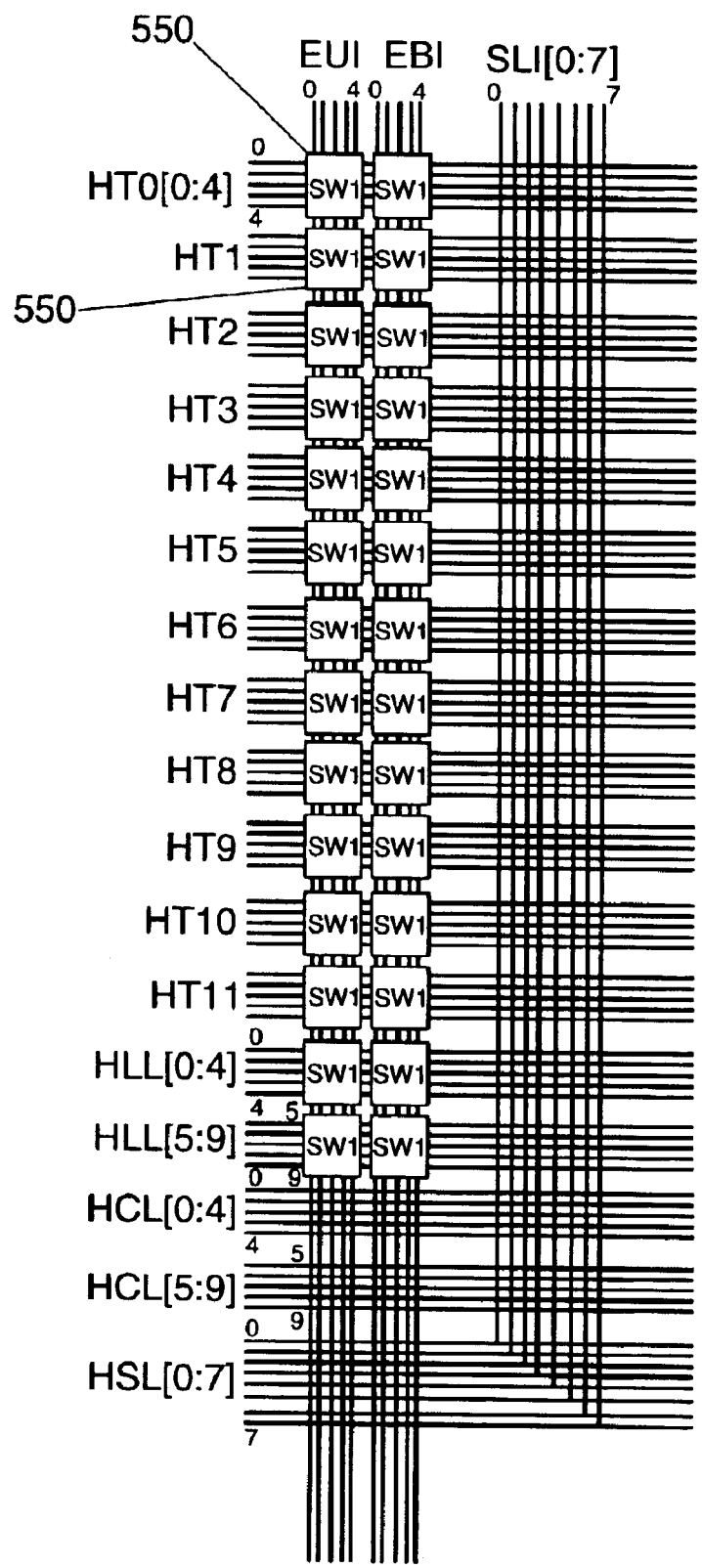
FIG. 9a is a schematic illustrating a more detailed view of a bus featured in FIG. 3.

FIG. 9a is a schematic illustrating the programmable interconnects for HA busses 295 and 297, shown in FIG. 3. Routing resource HT[0:11][0:4] is shown as 12 (0 through 11) sets of 5 (0 through 4) routing resources. HT[0:11][0:4] intersect the routing resource EUI and EBI at SW1 550. Routing resources HLL[0:9], HCL[0:9] and HSL[0:7] are also shown. HSL[0:7] is coupled to routing resource SLI [0:7]. Each SW1 550 comprises programmable interconnects distributed in the pattern indicated in FIG. 9b.

Figure 9B:
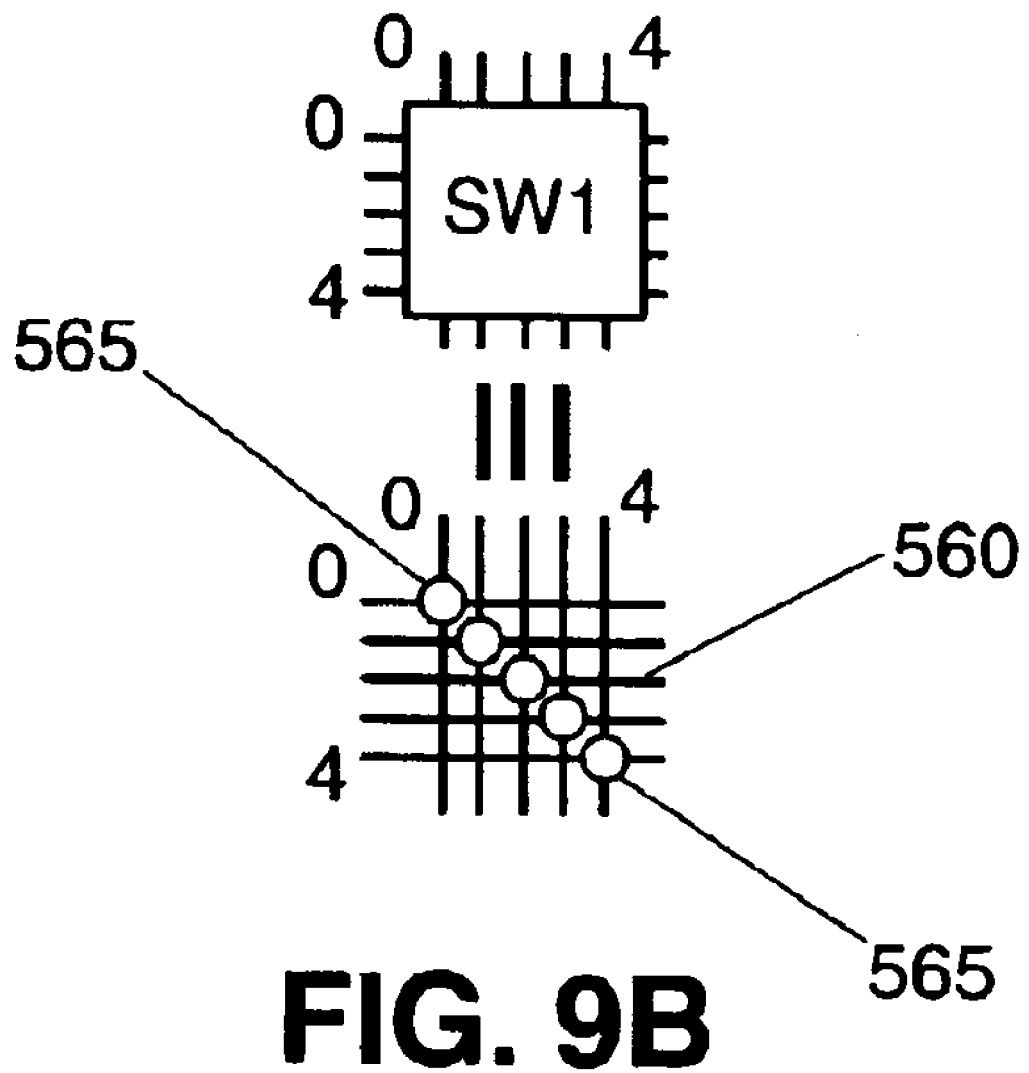

In FIG. 9b, SW1 represents programmable interconnects distributed in pattern 560. Circle 565 represents a transistor switch and memory cell, as illustrated in FIG. 8d, coupling together the lines that intersect at circle 565. For example, referring to FIGS. 9a and 9b, and SW1 550, circle 565 is at the intersect of lines HT0[0] with EUI[0] and EBI[0], HT0[1] with EUI[1] and EBI[1], HT0[2] with EUI[2] and EBI[2], HT0[3] with EUI[3] and EBI[3], HT0[4] with EUI[4] and EBI[4], and so on, through HLL[9] with EUI[4] and EBI[4].

Figure 10A:
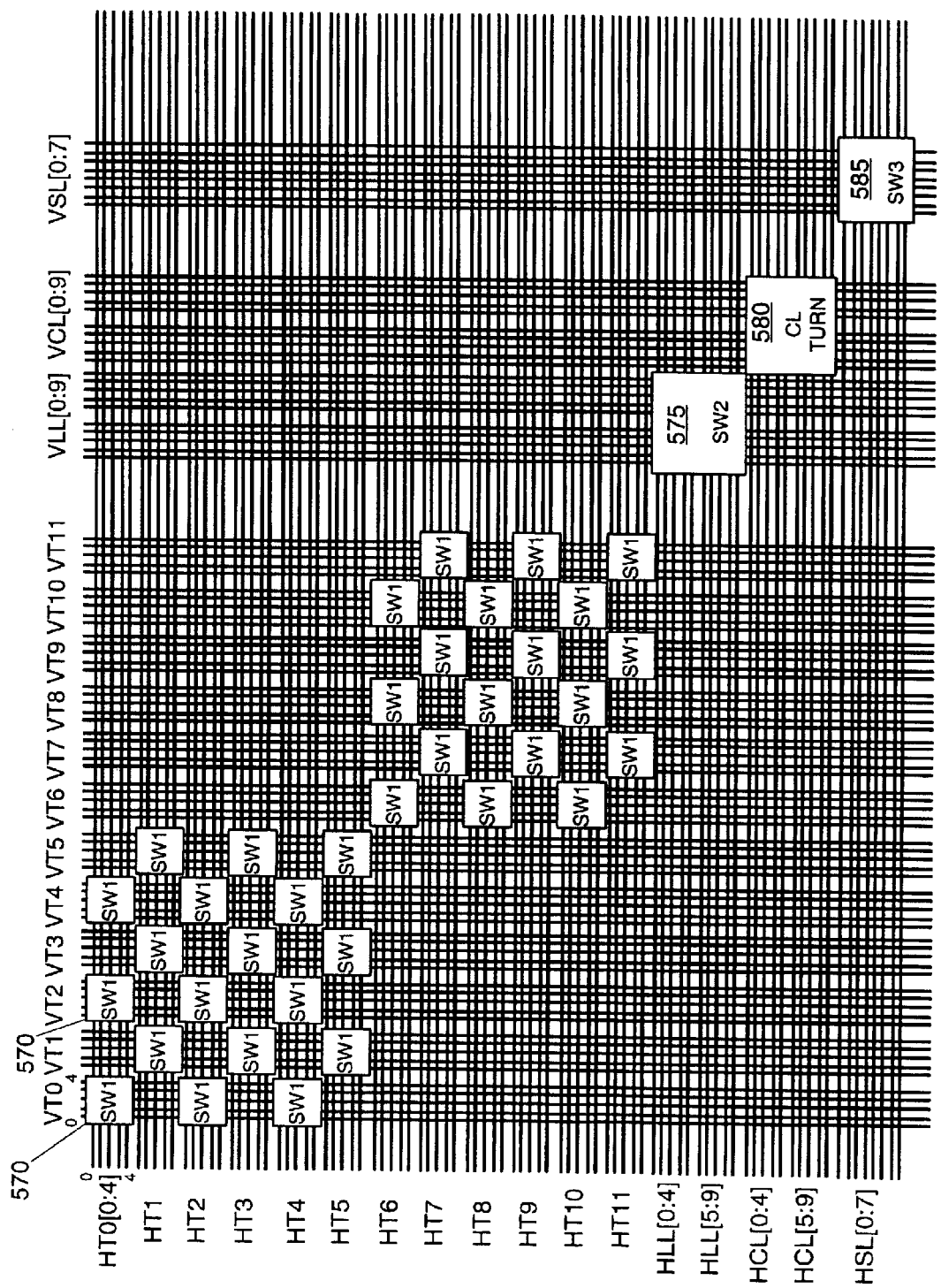
FIG. 10a is a schematic illustrating a more detailed view of a bus featured in FIG.3.

FIG. 10a is a schematic illustrating the programmable interconnects for XA bus 293, see FIG. 3. Routing resources HT[0:11][0:4] and VT[0:11][0:4] intersect at SW1 570. The routing resource HLL[0:9] intersects the routing resource VLL[0:9] at SW2 575. The routing resource HCL[0:9] intersects the routing resource VCL[0:9] at CL TURN 580. The routing resource HSL[0:7] intersects the routing resource VSL[0:7] at SW3 585. Each SW1 570 is comprised of programmable interconnects arranged in the pattern shown in FIG. 10b.

Figure 10B:
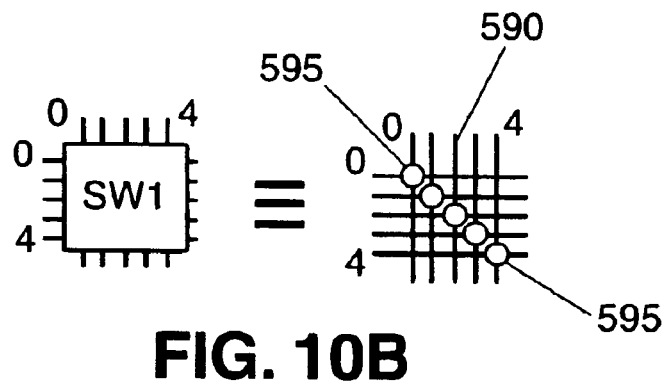

In FIG. 10b, SW1 represents programmable interconnects distributed in pattern 590. Circle 595 represents a transistor switch and memory cell, as illustrated in FIG. 8d, coupling together the lines that intersect at circle 595. For example, referring to FIGS. 10a and 10b, and SW1 570, circle 595 is at the intersect of lines HT0[0] with VT0[0] and VT2[0] and VT4[0], HT0[1] with VT0[1] and VT2[1] and VT4[1], HT0[2] with VT0[2] and VT2[2] and VT4[2], HT0[3] with VT0[3] and VT2[3] and VT4[3], and so on, through HT11[4] with VT7[4] and VT9[4] and VT11[4].

Figure 10C:
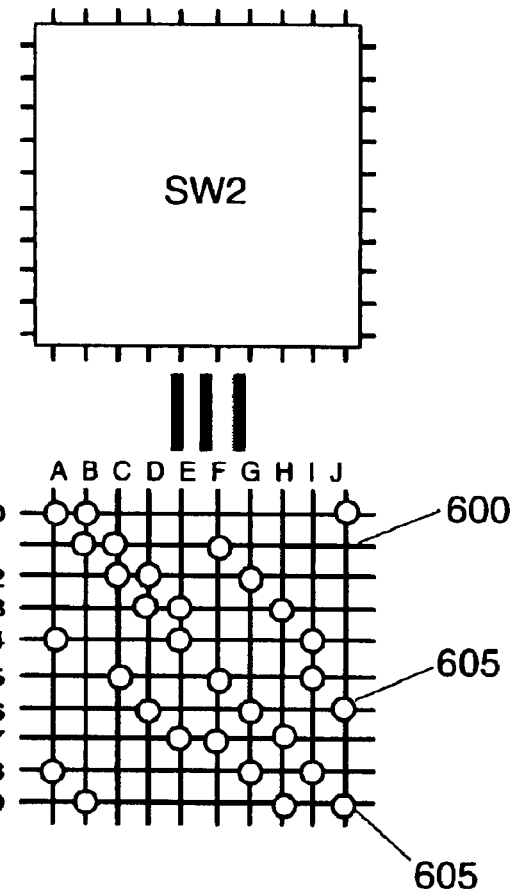

In FIG. 10c, SW2 represents programmable interconnects distributed in pattern 600. Circle 605 represents a transistor switch and memory cell, as illustrated in FIG. 8d, coupling together the lines that intersect at circle 605. For example, referring to FIGS. 10a and 10c, and SW2 575, circle 605 is at the intersect of lines HLL[0] with VLL[0] and VLL[1] and VLL[9], HLL[1] with VLL[1] and VLL[2] and VLL[5], HLL[2] with VLL[2] and VLL[3] and VLL[6], HLL[3] with VLL[3] and VLL[4] and VLL[7], and so on, through HLL[9] with VLL[1] and VLL[7] and VLL[9].

Another method of identifying pattern 600 is to label the vertical set of conductors with a letter, left to right, from letter 'A' to letter 'J' and the horizontal set of conductors with a number, top to bottom, from number '0' to number '9'. The conductors are therefore coupled together at the intersection of A0, B0, J0, B1, C1, F1, C2, D2, G2, D3, E3, H3, A4, E4, I4, C5, F5, I5, D6, C6, J6, E7, F7, H7, A8, G8, I8, B9, H9, and J9.

Figure 10D:
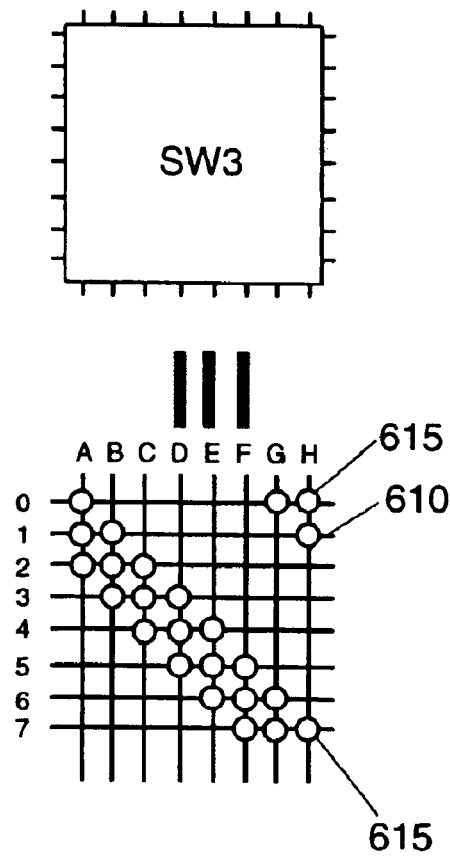

In FIG. 10d, SW3 represents programmable interconnects distributed in pattern 610. Circle 615 represents a transistor switch and memory cell, as illustrated in FIG. 8d, coupling together the lines that intersect at circle 615. For example, referring to FIGS. 10a and 10d, and SW3 585, circle 615 is at the intersect of lines HSL[0] with VSL[0] and VSL[6] and VSL[7], HSL[1] with VSL[0] and VSL[1] and VSL[7], HSL[2] with VSL[0] and VSL[1] and VSL[2], HSL[3] with VSL[1) and VSL[2] and VSL[3], and so on, through HSL[7] with VSL[5] and VSL[6] and VSL[7].

Another method of identifying pattern 610 is to label the vertical set of conductors with a letter, left to right, from letter 'A' to letter 'H' and the horizontal set of conductors with a number, top to bottom, from number '0' to number '7.' The conductors are therefore coupled together at the intersection of A0, G0, H0, A1, B1, H1, A2, B2, C2, B3, C3, D3, C4, D4, E4, D5, E5, F5, E6, F6, G6, F7, G7, and H7.

Figure 11B:
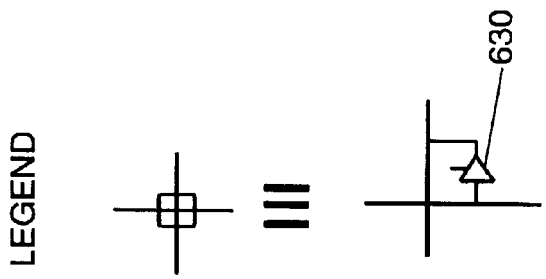
FIG. 11b is a schematic illustrating one embodiment of a more detailed programmable interconnect.
Figure 11A:
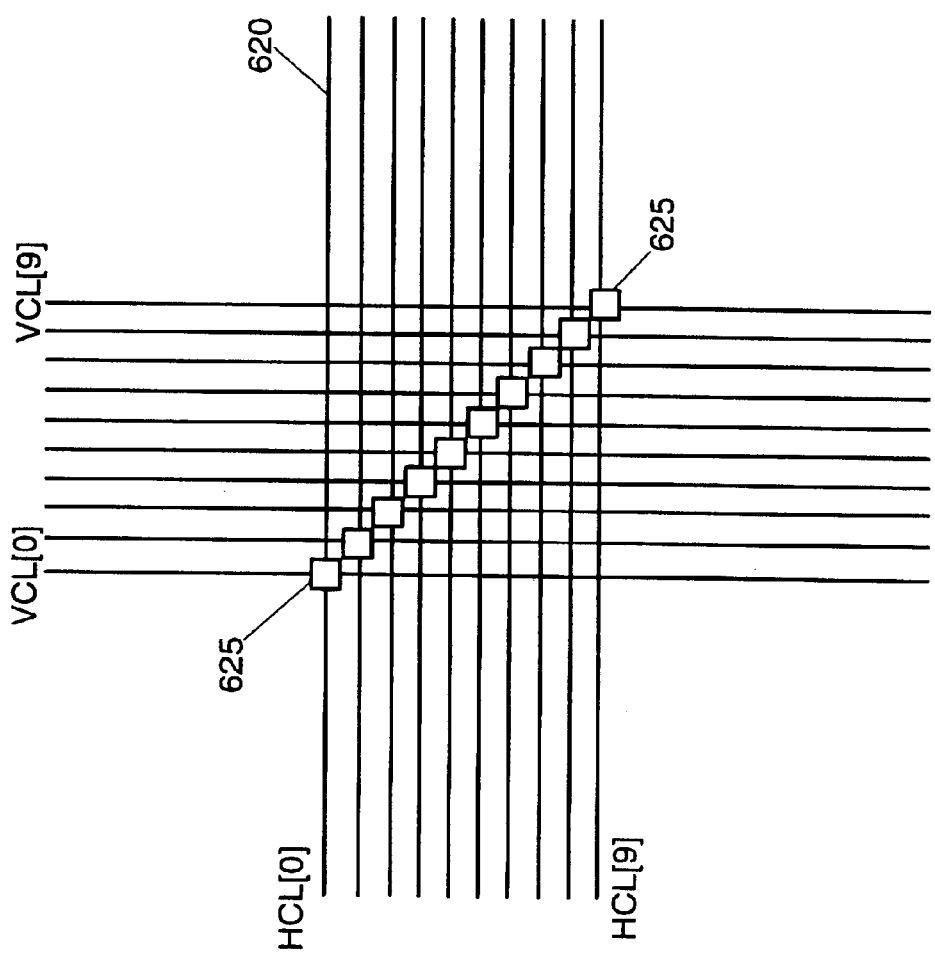

In FIG. 11a, CL TURN 580, from FIG. 10a represents programmable interconnects distributed in pattern 620. Block 625 represents a three-state transistor, illustrated in FIG. 11b, coupling together the lines that intersect at block 625. For example, referring to FIGS. 10a and 11a, and CL TURN 580, block 625 is at the intersect of lines HCL[0] with VCL[0], HCL[1] with VCL[1], HCL[2] with VCL[2], HCL[3] with VCL[3], and so on, through HCL[9] with VCL[9].

FIG. 11b is a schematic illustrating one embodiment of blocks 625 in FIG. 11a. Three-state transistor 630 has its source and drain coupled to intersecting signal lines.

Figure 12A:
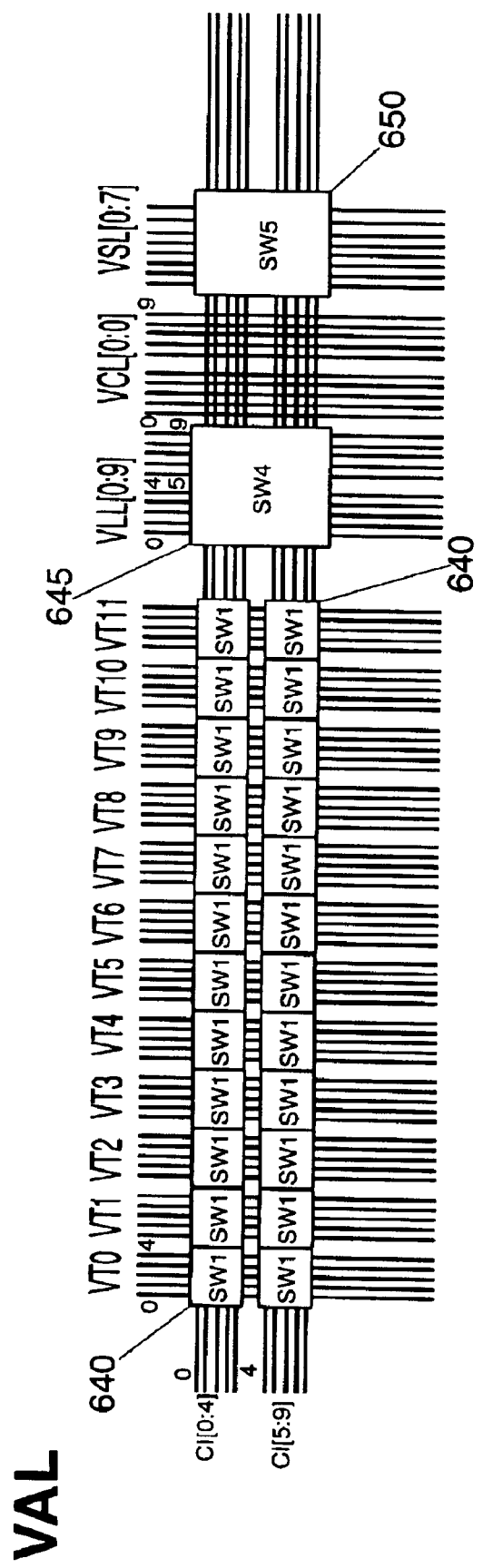
FIG. 12a is a schematic illustrating a more detailed view of a bus featured in FIG. 6.

FIG. 12a illustrates routing resources for VAL bus 418, shown in FIG. 6. Routing resource VT[0:11][0:4] is shown as 12 (0 through 11) sets of 5 (0 through 4) routing resources. VT[0:11][0:4] intersect routing resource CI[0:4] and CI[5:9] at SW1 640. Routing resources VLL[0:9], VCL[0:9] and VSL[0:7] are also shown. VLL[0:9] and VSL[0:7] intersect both of the CI[0:4] and CI[5:9] routing resources at SW4 645 and SW5 650.

Figure 12B:
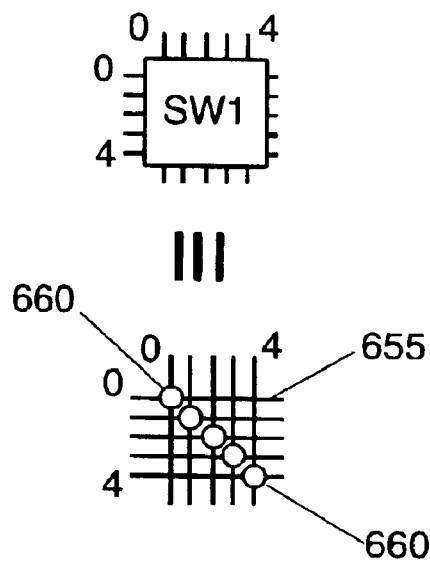
Figure 12C:
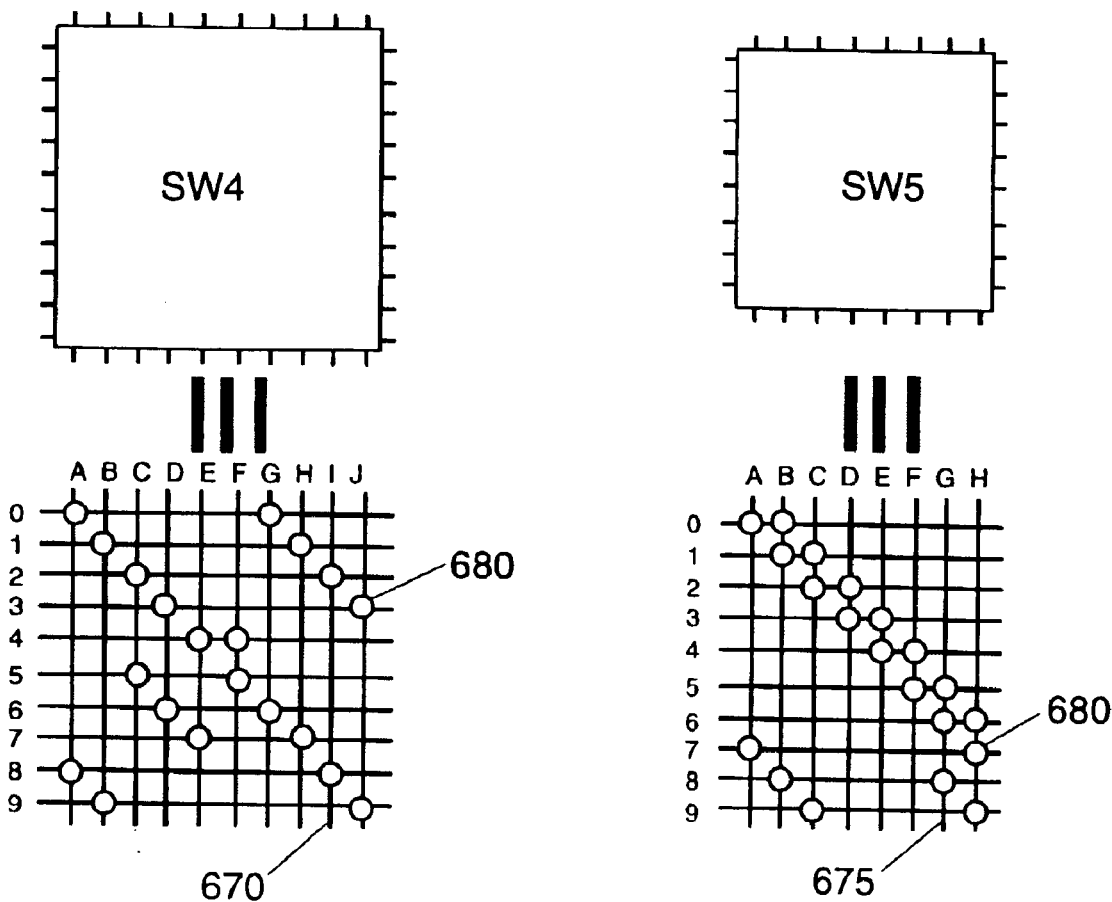

FIGS. 12b and 12c illustrate SW1, SW4 and SW5 in greater detail. In FIG. 12b, SW1 represents programmable interconnects distributed in pattern 655. Circle 660 represents a transistor switch and memory cell, as illustrated in FIG. 8d, coupling together the lines that intersect at circle 660. For example, referring to FIGS. 12a and 12b, and SW1 640, circle 660 is at the intersect of lines CI[0] with to VT0[0] and VT][0] and VT2[0] and VT3[0] and VT4[0] and VT5[0] and VT6[0] and VT7[0] and VT8[0] and VT[0] and VT10[0] and VT11[0], CI[1] with VT0[1] and VT1[1] and VT2[1] and VT3[1] and VT4[1] and VT5[1] and VT6[1] and VT7[1] and VT8[1] and VT9[1] and VT10[1] and VT11[1].

FIG. 12c illustrates the programmable interconnect patterns for areas SW4 and SW5 from FIG. 12a. In patterns 670 and 675, circle 680 represents a transistor switch and memory cell, as illustrated in FIG. 8a, coupling together the lines that intersect at circle 680. For example, referring to FIG. 12a and 12c, SW4 645 and pattern 670 represent the interconnects for CI[0:4] and CI[5:9] with VLL[0:9]. Therefore, circle 670 is at the intersect of lines CI[0] with VLL[0] and VLL[6], CI[1] with VLL[1] and VLL[7], CI[2] and VLL[2] and VLL[8], CI[3] and VLL[3] and VLL[9], CI[4] and VLL[4] and VLL[5], and so on, through CI[9] with VLL[1] and VLL[9].

Another method of identifying pattern 670 is to label the vertical set of conductors with a letter, left to right, from letter 'A' to letter 'J' and the horizontal set of conductors with a number, top to bottom, from number '0' to number '9.' The conductors are therefore coupled together at the intersection of A0, G0, B1, H1, C2, I2, D3, J3, E4, F4, C5, F5, D6, G6, E7, H7, A8, I8, B9, and J9.

SW5 650, or pattern 675, represents the interconnects for CI[0:4] and CI[5:9] with VSL[0:7]. Circle 680 is at the intersect of lines CI[0] with VSL[0] and VSL[1], CI[1] with VSL[1] and VSL[2], CI[2] with VSL[2] and VSL[3], CI[3] with VSL[3] and VSL[4], CI[4] with VSL[4] and VSL[5], and so on, through CI[9] with VSL[2] and VSL[7].

Another method of identifying pattern 675 is to label the vertical set of conductors with a letter, left to right, from letter 'A' to letter 'H' and the horizontal set of conductors labeled with a number, top to bottom, from number '0' to number '9.' The conductors are therefore coupled together at the intersection of A0, B0, B1, C1, C2, D2, D3, E3, E4, F4, F5, G5, G6, H6, A7, H7, B8, G8, C9, H9.

Figure 13:
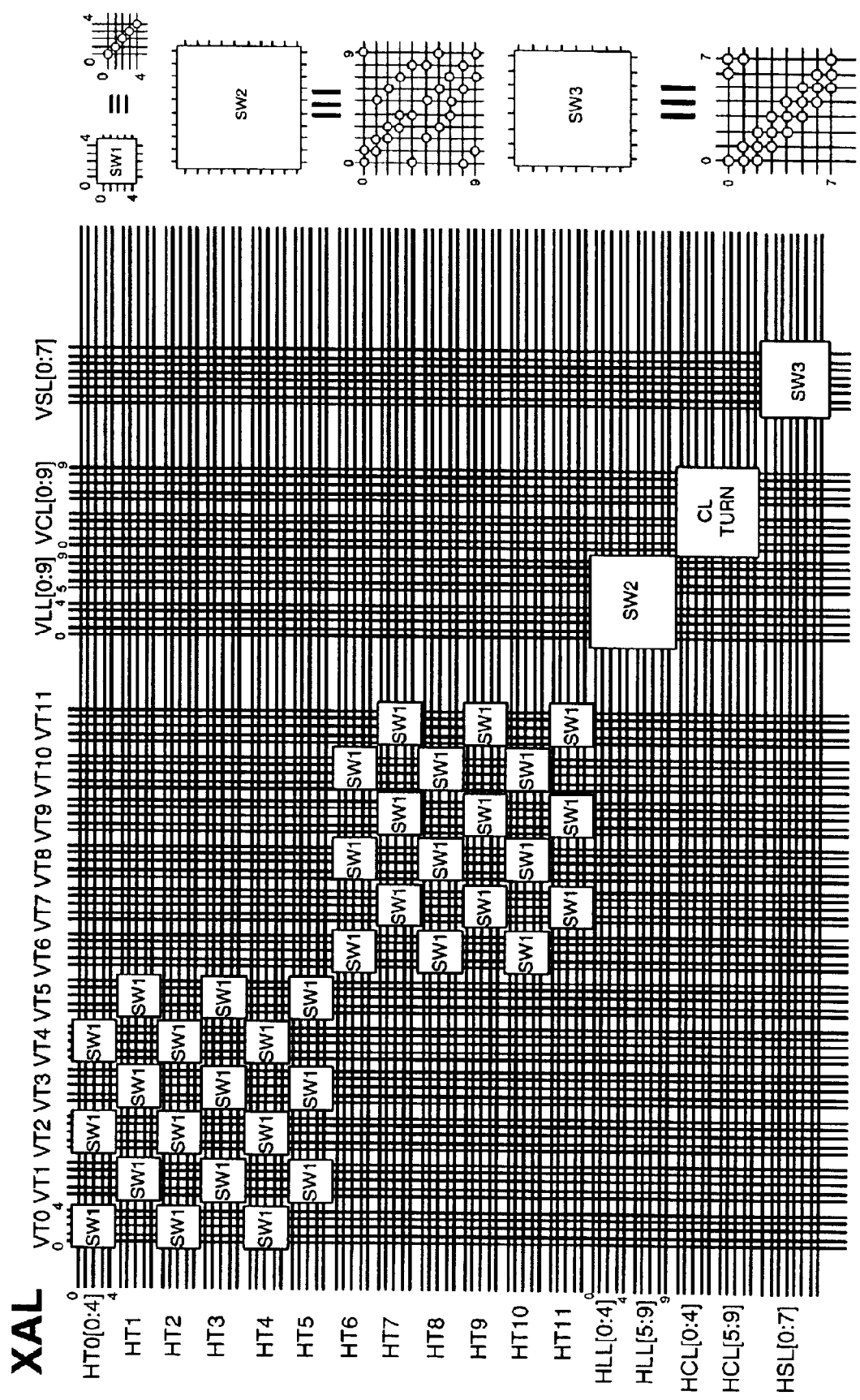
FIG. 13 is a schematic illustrating a more detailed view of a bus featured in FIG. 6.

FIG. 13 is a schematic illustrating the programmable interconnects for XAL bus 417, see FIG. 6. Routing resources and programmable interconnects for XAL bus 417 are identical to XA bus 293, in FIG. 3. Routing resources for XAL bus, also for XA bus, are illustrated in FIG. 10a, while SW1 programmable interconnects are illustrated in FIG. 10b, SW2 programmable interconnects are illustrated in FIG. 10c, SW3 programmable interconnects are illustrated in FIG. 10d, CL TURN programmable interconnects are illustrated in FIG. 11a and CL TURN three-state transistor couplings are illustrated in FIG. 11b.

FIG. 14a is a schematic illustrating the programmable interconnects for HAL bus 415, shown in FIG. 6. Routing resource HT[0:11][0:4] is shown as 12 (0 through 11) sets of 5 (0 through 4) routing resources. HT[0:11][0:4] intersect the routing resource CO[0:4] and CO[0:5] at SW1 700. Routing resources HLL[0:4] and HLL[5:9], HCL[0:4] and HCL[5:9], and HSL[0:7] are also shown. HSL[0:7] is coupled to routing resource SLI[0:7]. Each SW1 700 comprises programmable interconnects distributed in the pattern indicated in FIG. 14b.

In FIG. 14b, SW1 represents programmable interconnects distributed in pattern 560. Circle 710 represents a transistor switch and memory cell, as illustrated in FIG. 8d, coupling together the lines that intersect at circle 710. For example, referring to FIGS. 14a and 14b, and SW1 700, circle 710 is at the intersect of lines HT0[0] with CO[0] and CO[5], HT0[1] with CO[1] and CO[6], HT0[2] with CO[2] and CO[7], HT0[3] with CO[3] and CO[8], HT0[4] with CO[4] and CO[9], and so on, through HLL[9] with CO[4] and CO[9].

Figure 15A:
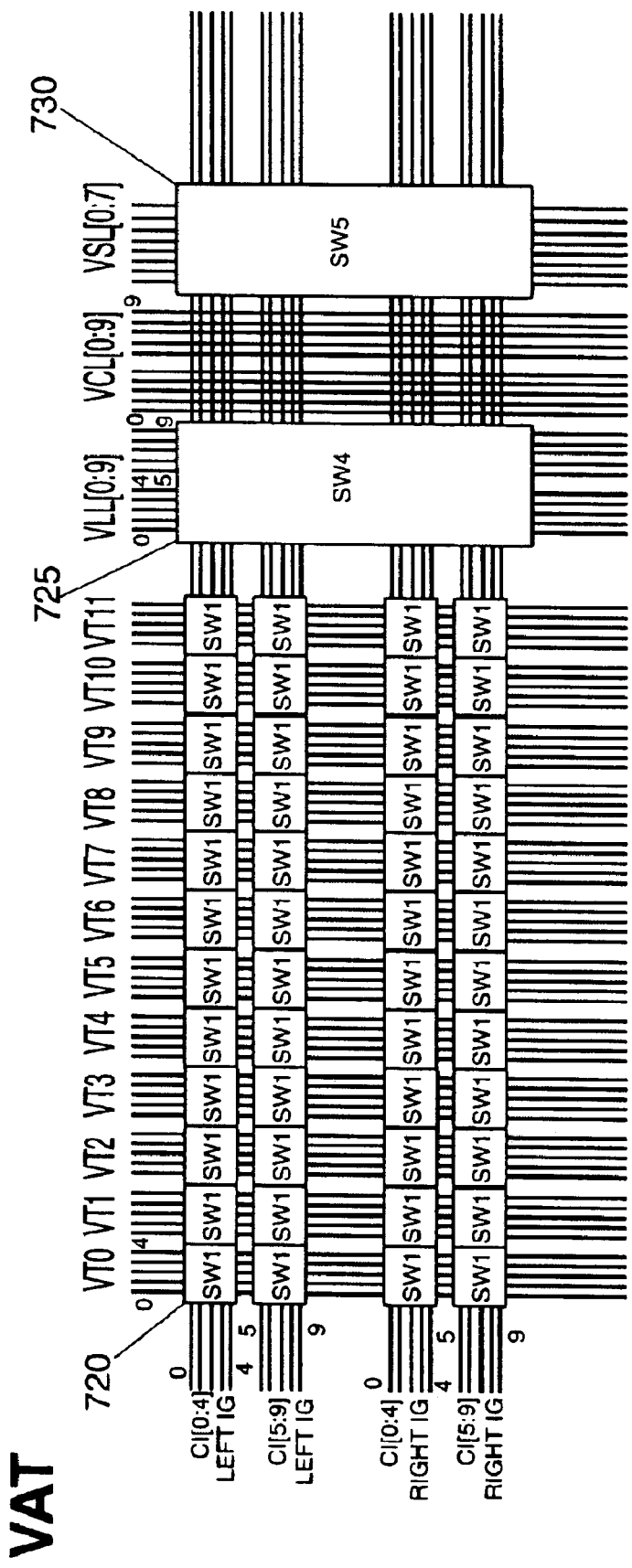
FIG. 15a is a schematic illustrating a more detailed view of a bus featured in FIG. 7.

FIG. 15a illustrates routing resources for VAT bus 432, shown in FIG. 7. Routing resource VT[0:11][0:4] is shown as 12 (0 through 11) sets of 5 (0 through 4) routing resources. VT[0:11][0:4] intersect routing resource CI[0:4] and CI[5:9] for a left IG (that is the IG on the left side of the VAT, for example IG 424 of FIG. 7) and another CI[0:4] and CI[5:9] for a right IG (that is the IG on the right side of the VAT, for example IG 428 of FIG. 7) at SW1 720. Routing resources VLL[0:9], VCL[0:9] and VSL[0:7] are also shown. VLL [0:9] and VSL[0:7] intersect both left and right IG CI[0:4] and CI[5:9] routing resources at SW4 725 and SW5 730.

Figure 15B:
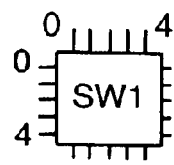
Figure 15B:
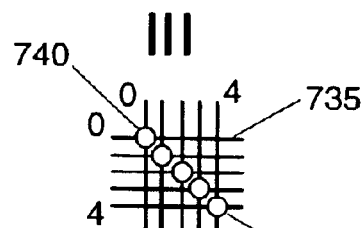

In FIG. 15b, SW1 represents programmable interconnects distributed in pattern 735. Circle 740 represents a transistor switch and memory cell, illustrated in FIG. 8d, coupling together the lines that intersect at circle 740. For example, referring to FIGS. 15a and 15b, and SW1 720, circle 740 is at the intersect, for the left IG portion of, lines CI[0] with VT0[0] and VT1[0] and VT2[0] and VT3[0] and VT4[0] and VT5[0] and VT6[0] and VT7[0] and VT8[0] and VT9[0] and VT10[0] and VT11[0], CI[1] with VT0[1] and VT1[1] and VT2[1] and VT3[1] and VT4[1] and VT5[1] and VT6[1] and VT7[1] and VT8[1] and VT9[1] and VT10[1] and VT11[1].

Figure 15C:
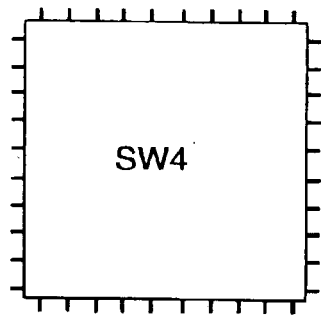
Figure 15C:
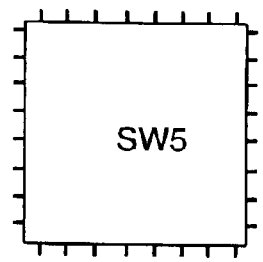
Figure 15C:
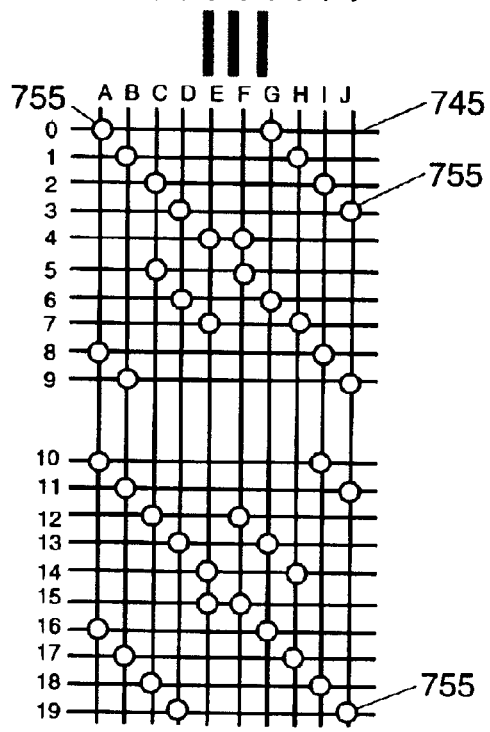
Figure 15C:
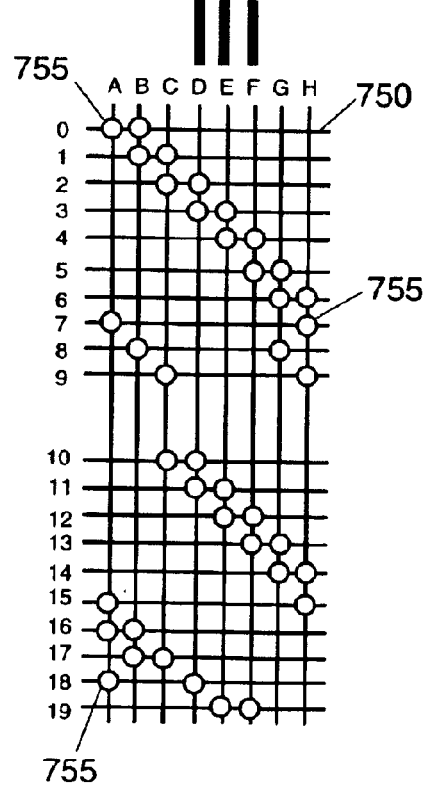

FIG. 15c illustrates the programmable interconnect patterns for areas SW4 and SW5. In patterns 745 and 750, circle 755 represents a transistor switch and memory cell, illustrated in FIG. 8d, coupling together the lines that intersect at circle 755. For example, referring to FIG. 15a and 15c, SW4 725, or pattern 745, represents the interconnects for left IG CI[0:4] and CI[5;9] and right IG CI[0:41] and CI[5:9] with VLL[0:9]. Therefore, circle 755 is at the intersect of lines, for the left IG, CI[0] with VLL[0] and VLL[6], CI[1] with VLL[1] and VLL[7], CI[2] with VLL[2] and VLL[8], CI[3] with VLL[3] and VLL[9], CI[4] with VLL[4] and VLL[5], and so on, through, for the right IG, CI[9] with VLL[3] and VLL[9].

Another method of identifying pattern 745 is to label the vertical set of conductors with a letter, left to right, from letter 'A' to letter 'J' and the horizontal set of conductors with a number, top to bottom, from number '0' to number '19.' The conductors are therefore coupled together at the intersection of A0, G0, B1, H1, C2, I2, D3, J3, E4, F4, C5, F5, D6, G6, E7, H7, A8, I8, B9, J9, A10, I10, B11, J11, C12, F12, D13, G13, E14, H14, E15, F15, A16, G16, B17, H17, C18, I18, D19, and J19.

In another example, referring to FIG. 15a and 15c, SW5 730, or pattern 750, represents the interconnects for left IG CI[0:41] and CI[5:9] and right IG CI[0:4] and CI[5:9] with VSL[0:7]. Therefore, circle 755 is at the intersect of lines, for the left IG, CI[0] with VSL[0] and VSL[1], CI[1] with VSL[1] and VSL[2], CI[2] with VSL[2] and VSL[3], CI[3] with VSL[3] and VSL[4], CI[4] with VSL[4] and VSL[5], and so on, through, for the right IG, CI[9] with VSL[4] and VSL[5].

Another method of identifying pattern 750 is to label the vertical set of conductors with a letter, left to right, from letter 'A' to letter 'H' and the horizontal set of conductors with a number, top to bottom, from number '0' to number '19.' The conductors are therefore coupled together at the intersection of A0, B0, B1, C1, C2, D2, D3, E3, E4, F4, F5, G5, G6, H6, A7, H7, B8, G8, C9, H9, C10, D10, D11, E11, E12, F12, F13, G13, G14, H14, A15, H15, A16, B16, B17, C17, A18, D18, E19, and F19.

Figure 16:
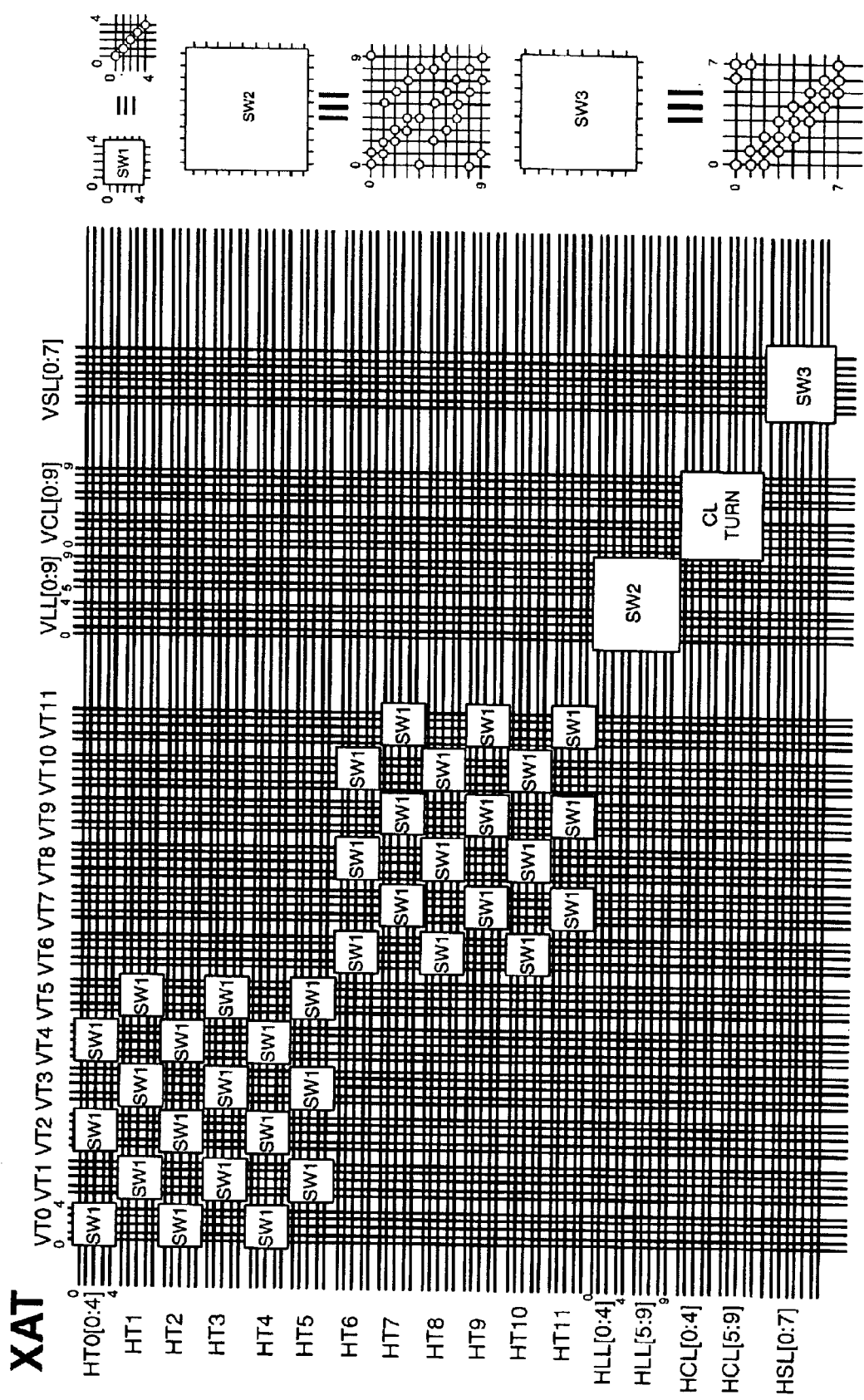
FIG. 16 is a schematic illustrating a more detailed view of a bus featured in FIG. 7.

FIG. 16 is a schematic illustrating the programmable interconnects for XAT bus 444, shown in FIG. 7. Routing resources and programmable interconnects for XAT bus 444 is identical to XAL bus 417, in FIG. 6. Routing resources for XAT bus, also for XAL bus, are illustrated in FIG. 10a, while SW1 programmable interconnects are illustrated in FIG. 10b, SW2 programmable interconnects are illustrated in FIG. 10c, SW3 programmable interconnects are illustrated in FIG. 10d, CL TURN programmable interconnects are illustrated in FIG. 11a and CL TURN three-state transistor couplings are illustrated in FIG. 11b.

FIG. 17a is a schematic illustrating the programmable interconnects for HAT busses 436 and 440, shown in FIG. 7. Routing resource HT[0:11][0:4] is shown as 12 (0 through 11) sets of 5 (0 through 4) routing resources. HT[0:11][0:4] intersect the routing resource EUI and CO[0:4] and CO[5:9] at SW1 760. Routing resources HLL[0:41] and HLL[5:9], HCL[0:4] and HCL [5:9] and HSL[0:7] are also shown. HSL[0:7] is coupled to routing resource SLI[0:7]. Each SW1 760 comprises programmable interconnects distributed in the pattern indicated in FIG. 9b.

In FIG. 17b, SW1 represents programmable interconnects distributed in pattern 765. Circle 770 represents a transistor switch and memory cell, as illustrated in FIG. 8d, coupling together the lines that intersect at circle 770. For example, referring to FIGS. 17a and 17b, and SW1 760, circle 770 is at the intersect of lines HT0[0] with EUI[0] and CO[0] and CO[5], HT0[1] with EUI[1] and CO[1] and CO[6], HT0[2] with EUI[2] and CO[2] and CO[7], HT0[3] with EUI[3] and CO[3] and CO[8], HT0[4] with EUI[4] and CO[4] and CO[5], and so on, through HLL[9] with EUI[4] and CO[4] and CO[9].

FIG. 18 is a schematic illustrating one embodiment of a secondary intra-tile global routing resource. The secondary intra-tile global routing resource includes the output LINT routing resource. The secondary intra-tile global routing resource may be necessary because in some situations the regular routing output signals Y[0:4] cannot be sent to an intended FG because the regular routing buses and routing interconnect areas do not provide the necessary connections. Or, in other situations, it may be desirable not to use the system central processing unit (CPU) time to send a signal through the regular routing buses and routing interconnect areas. In these situations, the needed one of the regular routing output resource Y[0:4] can be selected for the LINT output. The LINT output is can be routed to any FG or IG on an FPGA tile by a routing structure that is separate from the regular routing buses and routing interconnect areas used to route the regular routing output Y[0:4]. The LINT outputs are received by the FG on inputs GG[0:7] which are coupled to 8 channel bus EGG[0:7] 800. EGG[0:7] 800 is routed within the boundaries of an FPGA tile.

IG and FG column 810 is shown, with each IG and FG having a LINT output. The LINT output from IG and FG column 810 couples to 18 to 8 multiplexer 820. Each of the 8 outputs from multiplexer 820 can drive through a 3-state buffer to one of the lines of EGG[0:7] 800. This architecture is repeated for each column of IG-FG array.

From this disclosure, it will be apparent to persons of ordinary skill in the art that various alternatives to the embodiments of the disclosed system described herein may be employed in practicing the disclosed system. It is intended that the following claims define the scope of the disclosed system and that structures and methods within the scope of these claims and their equivalents be covered thereby.

What is claimed is:

1. A Field Programmable Gate Array comprising:
   an array of Field Programmable Gate Array tiles;
   a JTAG interface, a Configuration interface and a BIST interface each located adjacent to an outer edge of said array of Field Programmable Gate Array tiles;
   a plurality of boundary scan register chains located adjacent to an outer perimeter of said array of Field Programmable Gate Array tiles and said JTAG interface, said Configuration interface and said BIST interface;
   a plurality of RAM blocks located adjacent to an outer perimeter of said plurality of boundary register scan chains; and
   a plurality of input/output pad rings located adjacent to an outer perimeter of said plurality of ram blocks.

2. The Field Programmable Gate Array of claim 1, wherein at least one Field Programmable Gate Array tile comprises:
   a plurality of Functional Groups arranged as horizontally opposed pairs of Functional Groups, each pair including a left Functional Group and a right Functional Group, the plurality of Functional Groups arranged in rows and columns, each row having a left end and a right end and each column having a top end and a bottom end;
   an Interface Group located at each of said right end and said left end of each row;
   a pair of horizontally opposed Interface Groups located at each of said top end and said bottom end of each column;
   a primary routing structure coupled to said pairs of Functional Groups, said Interface Groups, and said pairs of Interface Groups and configured to receive primary output signals, route the primary output signals within the Field Programmable Gate Array tile, and provide primary input signals to said pairs of Functional Groups, said Interface Groups, and said pairs of Interface Groups; wherein:
      each pair of Functional Groups is configured to receive primary input signals, perform a logic operation, and generate primary output signals; and
      each Interface Group and pair of Interface Groups is configured to transfer signals from said primary routing structure to outside of the Field Programmable Gate Array tile, and includes a plurality of input multiplexers configurable to select signals received from outside of the Field Programmable Gate Array tile and provide signals to the primary routing structure inside the Field Programmable Gate Array tile.

3. The Field Programmable Gate Array of claim 2 further comprising a plurality of input/output pads coupled to at least one of said input multiplexers of at least one of said Interface Groups and pairs of Interface Groups.

4. The Field Programmable Gate Array of claim 2, further comprising:
   a first bus between the left Functional Group and the right Functional Group, the first bus comprising:
      a top input from the left Functional Group;
      a bottom input from the right Functional Group, the top input comprising horizontal conductors situated above the bottom input, the bottom input comprising horizontal conductors, the top and bottom inputs intersecting a set of first conductors arranged vertically, the top and bottom inputs intersecting a set of second conductors arranged vertically; and
      a set of third conductors arranged vertically.

5. The Field Programmable Gate Array of claim 4, further comprising:
   the top and bottom inputs comprising a horizontal set of ten conductors, the set of first conductors comprising a vertical set of ten conductors, considering the vertical set of conductors to comprise conductors designated, left to right, from letter 'A' to letter 'J,' and considering the horizontal set of conductors to comprise conductors designated, top to bottom, from number '0' to number '9', wherein the horizontal set of conductors and the vertical set of conductors intersect and are coupled together at the intersection of conductors A0, G0, B1, H1, C2, I2, D3, J3, E4, F4, C5, F5, D6, G6, E7, H7, A8, I8, B9, and J9.

6. The Field Programmable Gate Array of claim 4, further comprising:
   the top and bottom inputs comprising a horizontal set of ten conductors, the set of second conductors comprising a vertical set of eight conductors, considering the vertical set of conductors to comprise conductors designated, left to right, from letter 'A' to letter 'H,' and considering the horizontal set of conductors to comprise conductors designated, top to bottom, from number '0' to number '9', wherein the horizontal set of conductors and the vertical set of conductors intersect and are coupled together at the intersection of conductors A0, B0, B1, C1, C2, D2, D3, E3, E4, F4, F5, G5, G6, H6, A7, H7, B8, G8, C9, H9.

7. The Field Programmable Gate Array of claim 6, further comprising:
   a transistor switch coupling together each of the intersections between the horizontal conductors and the vertical conductors; and
   a memory cell coupled to the transistor switch.

8. The Field Programmable Gate Array of claim 4, further comprising:
   a second bus located beneath each of the left Functional Group and the right Functional Group, the second bus comprising:
   a set of fourth conductors arranged horizontally;
   a set of fifth conductors arranged horizontally; and
   a set of sixth conductors arranged horizontally, the set of sixth conductors coupled to a Functional Group coupled to and above the second bus.

9. The Field Programmable Gate Array of claim 8, further comprising:
   a third bus located adjacent to each first bus and between each second bus, the third bus comprising:
      the set of fourth conductors arranged horizontally;
      the set of fifth conductors arranged horizontally;

the set of sixth conductors arranged horizontally;
the set of first conductors arranged vertically;
the set of third conductors arranged vertically; and
the set of second conductors arranged vertically.

10. The Field Programmable Gate Array of claim 9, further comprising:
the set of fourth conductors comprising a horizontal set of ten conductors, the set of first conductors comprising a vertical set of ten conductors, considering the vertical set of conductors to comprise conductors designated, left to right, from letter 'A' to letter 'J,' and considering the horizontal set of conductors to comprise conductors designated, top to bottom, from number '0' to number '9', wherein the horizontal set of conductors and the vertical set of conductors intersect and are coupled together at the intersection of conductors A0, B0, J0, B1, C1, F1, C2, D2, G2, D3, E3, H3, A4, E4, I4, C5, F5, I5, D6, G6, J6, E7, F7, H7, A8, G8, I8, B9, H9, and J9.

11. The Field Programmable Gate Array of claim 10, further comprising:
a transistor switch coupling together each of the intersections between the horizontal conductors and the vertical conductors; and
a memory cell coupled to the transistor switch.

12. The Field Programmable Gate Array of claim 9, further comprising:
the set of sixth conductors comprising a horizontal set of eight conductors, the set of second conductors comprising a vertical set of eight conductors, considering the vertical set of conductors to comprise conductors designated, left to right, from letter 'A' to letter 'H,' and considering the horizontal set of conductors to comprise conductors designated, top to bottom, from number '0' to number '7', wherein the horizontal set of conductors and the vertical set of conductors intersect and are coupled together at the intersection of conductors A0, G0, H0, A1, B1, H1, A2, B2, C2, B3, C3, D3, C4, D4, E4, D5, E5, F5, E6, F6, G6, F7, G7, and H7.

13. The Field Programmable Gate Array of claim 12, further comprising:
a transistor switch coupling together each of the intersections between the horizontal conductors and the vertical conductors; and
a memory cell coupled to the transistor switch.

14. The Field Programmable Gate Array of claim 9, further comprising:
a three-state transistor coupling together the set of fifth conductors and the set of third conductors.

15. The Field Programmable Gate Array of claim 2, further comprising:
a fourth bus coupled between each Interface Group and a horizontally adjacent Functional Group, the fourth bus comprising:
an input from the Interface Group;
a set of first conductors arranged vertically and intersecting the CI input;
a set of third conductors arranged vertically; and
a set of second conductors arranged vertically and intersecting the input.

16. The Field Programmable Gate Array of claim 15, further comprising:
the input comprising a horizontal set of ten conductors, the set of first conductors comprising a vertical set of ten conductors, considering the vertical set of conductors to comprise conductors designated, left to right, from letter 'A' to letter 'J,' and considering the horizontal set of conductors to comprise conductors designated, top to bottom, from number '0' to number '9', wherein the horizontal set of conductors and the vertical set of conductors intersect and are coupled together at the intersection of conductors A0, G0, B1, H1, C2, I2, D3, J3, E4, F4, C5, F5, D6, G6, E7, H7, A8, I8, B9, and J9.

17. The Field Programmable Gate Array of claim 15, further comprising:
the input comprising a horizontal set of ten conductors, the set of second conductors comprising a vertical set of eight conductors, considering the vertical set of conductors to comprise conductors designated, left to right, from letter 'A' to letter 'H,' and considering the horizontal set of conductors to comprise conductors designated, top to bottom, from number '0' to number '9', wherein the horizontal set of conductors and the vertical set of conductors intersect and are coupled together at the intersection of conductors A0, B0, B1, C1, C2, D2, D3, E3, E4, F4, F5, G5, G6, H6, A7, H7, B8, G8, C9, H9.

18. The Field Programmable Gate Array of claim 15, further comprising:
a fourth bus coupling each vertically adjacent Interface Group, the fourth bus comprising:
a set of fourth conductors arranged horizontally;
a set of fifth conductors arranged horizontally; and
a set of sixth conductors arranged horizontally, the set of sixth conductors coupled to an Interface Group connected to and above the fourth bus.

19. The Field Programmable Gate Array of claim 18, further comprising:
a fifth bus located between each fourth bus and adjacent to each second bus, the fifth bus comprising:
the set of fourth conductors arranged horizontally;
the set of fifth conductors arranged horizontally;
the set of sixth conductors arranged horizontally;
the set of first conductors arranged vertically;
the set of third conductors arranged vertically; and
the set of second conductors arranged vertically.

20. The Field Programmable Gate Array of claim 19, further comprising:
the set of fourth conductors comprising a horizontal set of ten conductors, the set of first conductors comprising a vertical set of ten conductors, considering the vertical set of conductors to comprise conductors designated, left to right, from letter 'A' to letter 'J,' and considering the horizontal set of conductors to comprise conductors designated, top to bottom, from number '0' to number '9', wherein the horizontal set of conductors and the vertical set of conductors intersect and are coupled together at the intersection of conductors A0, B0, J0, B1, C1, F1, C2, D2, G2, D3, E3, H3, A4, E4, I4, C5, F5, I5, D6, G6, J6, E7, F7, H7, A8, G8, I8, B9, H9, and J9.

21. The Field Programmable Gate Array of claim 20, further comprising:
a transistor switch coupling together each of the intersections between the horizontal conductors and the vertical conductors; and
a memory cell coupled to the transistor switch.

22. The Field Programmable Gate Array of claim 19, further comprising:
the set of sixth conductors comprising a horizontal set of eight conductors, the set of second conductors comprising a vertical set of eight conductors, considering the vertical set of conductors to comprise conductors designated, left to right, from letter 'A' to letter 'H,' and considering the horizontal set of conductors to comprise conductors designated, top to bottom, from number '0' to number '7', wherein the horizontal set of conductors and the vertical set of conductors intersect and are coupled together at the intersection of conductors A0, G0, H0, A1, B1, H1, A2, B2, C2, B3, C3, D3, C4, D4, E4, D5, E5, F5, E6, F6, G6, F7, G7, and H7.

23. The Field Programmable Gate Array of claim 22, further comprising:
a transistor switch coupling together each of the intersections between the horizontal conductors and the vertical conductors; and
a memory cell coupled to the transistor switch.

24. The Field Programmable Gate Array of claim 19, further comprising:
a three-state transistor coupling together the set of fifth conductors and the set of third conductors.

25. The Field Programmable Gate Array of claim 2, further comprising:
each pair of Interface Groups comprising a left Interface Group and a right Interface Group;
a sixth bus between the left Interface Group and the right Interface Group, the sixth bus comprising:
a top input from the left Interface Group;
a bottom input from the right Interface Group, the top input comprising horizontal conductors situated above the bottom input, the bottom input comprising horizontal conductors, the top and bottom inputs intersecting a set of first conductors arranged vertically, the top and bottom inputs intersecting a set of second conductors arranged vertically; and
a set of third conductors arranged vertically.

26. The Field Programmable Gate Array of claim 25, further comprising:
the top and bottom inputs comprising a horizontal set of twenty conductors, the set of first conductors comprising a vertical set of ten conductors, considering the vertical set of conductors to comprise conductors designated, left to right, from letter 'A' to letter 'J,' and considering the horizontal set of conductors to comprise conductors designated, top to bottom, from number '0' to number '19', wherein the horizontal set of conductors and the vertical set of conductors intersect and are coupled together at the intersection of conductors A0, G0, B1, H1, C2, I2, D3, J3, E4, F4, C5, F5, D6, G6, E7, H7, A8, I8, B9, J9, A10, I10, B11, J11, C12, F12, D13, G13, E14, H14, E15, F15, A16, G16, B17, H17, C18, I18, D19, and J19.

27. The Field Programmable Gate Array of claim 25, further comprising:
the top and bottom inputs comprising a horizontal set of twenty conductors, the set of second conductors comprising a vertical set of eight conductors, considering the vertical set of conductors to comprise conductors designated, left to right, from letter 'A' to letter 'H,' and considering the horizontal set of conductors to comprise conductors designated, top to bottom, from number '0' to number '19', wherein the horizontal set of conductors and the vertical set of conductors intersect and are coupled together at the intersection of conductors A0, B0, B1, C1, C2, D2, D3, E3, E4, F4, F5, G5, G6, H6, A7, H7, B8, G8, C9, H9, C10, D10, D11, E11, E12, F12, F13, G13, G14, H14, A15, H15, A16, B16, B17, C17, A18, D18, E19, and F19.

28. The Field Programmable Gate Array of claim 27, further comprising:
a transistor switch coupling together each of the intersections between the horizontal conductors and the vertical conductors; and
a memory cell coupled to the transistor switch.

29. The Field Programmable Gate Array of claim 25, further comprising:
a seventh bus located beneath each of the left Interface Group and the right Interface Group, the seventh bus comprising:
a set of fourth conductors arranged horizontally;
a set of fifth conductors arranged horizontally; and
a set of sixth conductors arranged horizontally, the set of sixth conductors coupled to the pair of Interface Groups coupled to and above the seventh bus.

30. The Field Programmable Gate Array of claim 29, further comprising:
an eighth bus located beneath each sixth bus and between each seventh bus, the third bus comprising:
the set of fourth conductors arranged horizontally;
the set of fifth conductors arranged horizontally;
the set of sixth conductors arranged horizontally;
the set of first conductors arranged vertically;
the set of third conductors arranged vertically; and
the set of second conductors arranged vertically.

31. The Field Programmable Gate Array of claim 30, further comprising:
the set of fourth conductors comprising a horizontal set of ten conductors, the set of first conductors comprising a vertical set of ten conductors, considering the vertical set of conductors to comprise conductors designated, left to right, from letter 'A' to letter 'J,' and considering the horizontal set of conductors to comprise conductors designated, top to bottom, from number '0' to number '9', wherein the horizontal set of conductors and the vertical set of conductors intersect and are coupled together at the intersection of conductors A0, B0, J0, B1, C1, F1, C2, D2, G2, D3, E3, H3, A4, E4, I4, C5, F5, I5, D6, G6, J6, E7, F7, H7, A8, G8, I8, B9, H9, and J9.

32. The Field Programmable Gate Array of claim 31, further comprising:
a transistor switch coupling together each of the intersections between the horizontal conductors and the vertical conductors; and
a memory cell coupled to the transistor switch.

33. The Field Programmable Gate Array of claim 30, further comprising:
the set of sixth conductors comprising a horizontal set of eight conductors, the set of second conductors comprising a vertical set of eight conductors, considering the vertical set of conductors to comprise conductors designated, left to right, from letter 'A' to letter 'H,' and considering the horizontal set of conductors to comprise conductors designated, top to bottom, from number '0' to number '7', wherein the horizontal set of conductors and the vertical set of conductors intersect and are coupled together at the intersection of conductors A0, G0, H0, A1, B1, H1, A2, B2, C2, B3, C3, D3, C4, D4, E4, D5, E5, F5, E6, F6,G6, F7, G7, and H7.

34. The Field Programmable Gate Array of claim 33, further comprising:
a transistor switch coupling together each of the intersections between the horizontal conductors and the vertical conductors; and a memory cell coupled to the transistor switch.

35. The Field Programmable Gate Array of claim 30, further comprising:

a three-state transistor coupling together the set of fifth conductors and the set of third conductors.

36. The Field Programmable Gate Array of claim 4, wherein each of the pairs of Functional Groups and each of the Interface Groups and pairs of Interface Groups comprise a secondary output and a multiplexer, said multiplexer configured to route of the primary output signals to said secondary output.

37. The Field Programmable Gate Array of claim 36 wherein each of the pairs of Functional Groups and each of the Interface Groups and pairs of Interface Groups are further configured to receive a secondary input signal at a secondary input.

38. The Field Programmable Gate Array of claim 37 further comprising a secondary routing structure independent of the primary routing structure and configured to select and route said secondary output signal among the Interface Groups and pairs of Interface Groups and pairs of Functional Groups within said at least one Field Programmable Gate Array tile.

39. The Field Programmable Gate Array of claim 38, wherein the secondary routing structure comprises a secondary routing bus coupled to said secondary input of each pair of Functional Groups and Interface Group and pairs of Interface Groups and said secondary output of each pair of Functional Groups and Interface Group and pair of Interface Groups.

40. The Field Programmable Gate Array of claim 39, wherein the secondary routing structure further comprises:

a secondary multiplexer associated with each column, a plurality of buffers; and wherein each said secondary multiplexer is coupled to each secondary output from each Interface Group and pairs of Interface Groups and pairs of Functional Groups comprising each column; and wherein each said secondary multiplexer is configured to select at least one secondary output signal from at least one of said Interface Groups and pairs of Interface Groups and pairs of Functional Groups comprising said column and send the at least one selected secondary output signal to said secondary routing bus via at least one buffer.

41. The Field Programmable Gate Array of claim 40, wherein all of the Field Programmable Gate Array titles are configured in the same manner as said at least one Field Programmable Gate Array tile.

\* \* \* \* \*